United States Patent
Tanaka

(10) Patent No.: US 8,330,221 B2
(45) Date of Patent: Dec. 11, 2012

(54) METHOD FOR MANUFACTURING SEMICONDUCTOR SUBSTRATE, AND SEMICONDUCTOR DEVICE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/853,518

(22) Filed: Aug. 10, 2010

(65) Prior Publication Data

US 2010/0301415 A1 Dec. 2, 2010

Related U.S. Application Data

(63) Continuation of application No. 12/213,514, filed on Jun. 20, 2008, now Pat. No. 7,776,718.

(30) Foreign Application Priority Data

Jun. 25, 2007 (JP) ................................. 2007-166725

(51) Int. Cl.
*H01L 21/78* (2006.01)

(52) U.S. Cl. ................. 257/347; 257/E21.599; 438/458

(58) Field of Classification Search .................. 257/347, 257/352, 51, 66–67, E21.19, E21.193, E21.599; 438/455, 458

See application file for complete search history.

(56) References Cited

U.S. PATENT DOCUMENTS

| | | | | |
|---|---|---|---|---|
| 4,569,700 A * | 2/1986 | Toyama | | 117/8 |
| 4,963,505 A * | 10/1990 | Fujii et al. | | 438/405 |
| 5,019,874 A * | 5/1991 | Inoue et al. | | 257/190 |
| 5,403,673 A * | 4/1995 | Haga et al. | | 428/688 |
| 5,493,986 A * | 2/1996 | Augusto | | 117/90 |
| 5,852,488 A | 12/1998 | Takemura | | |
| 5,981,443 A * | 11/1999 | Wen | | 505/329 |
| 6,372,609 B1 | 4/2002 | Aga et al. | | |
| 6,818,529 B2 * | 11/2004 | Bachrach et al. | | 438/455 |
| 7,038,277 B2 | 5/2006 | Chu et al. | | |
| 7,135,388 B2 * | 11/2006 | Ryu et al. | | 438/478 |
| 7,508,034 B2 | 3/2009 | Takafuji et al. | | |
| 7,655,566 B2 | 2/2010 | Fujii | | |
| 7,674,687 B2 * | 3/2010 | Henley | | 438/459 |
| 7,691,730 B2 * | 4/2010 | Gadkaree et al. | | 438/479 |
| 2003/0207545 A1 * | 11/2003 | Yasukawa | | 438/459 |
| 2005/0148121 A1 * | 7/2005 | Yamazaki et al. | | 438/149 |

(Continued)

FOREIGN PATENT DOCUMENTS

JP 2003-324188 11/2003

(Continued)

*Primary Examiner* — Hsien Ming Lee
*Assistant Examiner* — Michele Fan
(74) *Attorney, Agent, or Firm* — Eric J. Robinson; Robinson Intellectual Property Law Office, P.C.

(57) ABSTRACT

It is an object to form single-crystalline semiconductor layers with high mobility over approximately the entire surface of a glass substrate even when the glass substrate is increased in size. A first single-crystalline semiconductor substrate is bonded to a substrate having an insulating surface, the first single-crystalline semiconductor substrate is separated such that a first single-crystalline semiconductor layer is left remaining over the substrate having an insulating surface, a second single-crystalline semiconductor substrate is bonded to the substrate having an insulating surface so as to overlap with at least part of the first single-crystalline semiconductor layer provided over the substrate having an insulating surface, and the second single-crystalline semiconductor substrate is separated such that a second single-crystalline semiconductor layer is left remaining over the substrate having an insulating surface.

22 Claims, 16 Drawing Sheets

U.S. PATENT DOCUMENTS

| | | | |
|---|---|---|---|
| 2005/0151276 A1* | 7/2005 | Jang et al. | 257/903 |
| 2005/0210302 A1* | 9/2005 | Kato et al. | 713/320 |
| 2005/0221583 A1* | 10/2005 | Aspar et al. | 438/458 |
| 2005/0263835 A1* | 12/2005 | Sakama et al. | 257/411 |
| 2005/0266591 A1* | 12/2005 | Hideo | 438/22 |
| 2005/0282306 A1* | 12/2005 | Yamanaka | 438/57 |
| 2006/0108562 A1* | 5/2006 | Fukai | 252/299.5 |
| 2007/0026638 A1* | 2/2007 | Henley | 438/459 |
| 2007/0120681 A1* | 5/2007 | Yamazaki et al. | 340/572.8 |
| 2008/0272434 A1* | 11/2008 | Park et al. | 257/347 |

FOREIGN PATENT DOCUMENTS

| | | |
|---|---|---|
| JP | 2004-134675 | 4/2004 |

* cited by examiner

METHOD FOR MANUFACTURING SEMICONDUCTOR SUBSTRATE, AND SEMICONDUCTOR DEVICE

BACKGROUND OF THE INVENTION

1. Field of the Invention

The present invention relates to a method for manufacturing a semiconductor substrate. In particular, the present invention relates to a semiconductor substrate which is obtained by bonding a single-crystalline semiconductor layer or a polycrystalline semiconductor layer to a substrate having an insulating surface. In addition, the present invention relates to a semiconductor device using the semiconductor substrate.

2. Description of the Related Art

Integrated circuits have been developed, which use a semiconductor substrate called a silicon-on-insulator (SOI) substrate that has a thin single-crystalline semiconductor layer over an insulating surface, instead of a silicon wafer that is manufactured by thinly slicing an ingot of a single-crystalline semiconductor. The integrated circuits using an SOI substrate have attracted attention as an integrated circuit which reduces parasitic capacitance between a drain of a transistor and the substrate and improves the performance of a semiconductor integrated circuit.

As a method for manufacturing an SOI substrate, a hydrogen ion implantation separation method is known (for example, see Reference 1: U.S. Pat. No. 6,372,609). The hydrogen ion implantation separation method is a method in which, after an oxide film is formed over a surface of a silicon wafer by a thermal oxidation method or the like, hydrogen ions are implanted into the silicon wafer from the surface to form a microbubble layer at a predetermined depth from the surface, and a thin silicon layer (SOI layer) is bonded to another silicon wafer using the microbubble layer as a cleavage plane. In addition to heat treatment for separating the SOI layer, it is necessary to perform heat treatment in an oxidizing atmosphere to form an oxide film on the SOI layer and perform heat treatment at 1000° C. to 1300° C. in a reducing atmosphere to increase the bond strength after removing the oxide film.

As one of examples of an SOI substrate in which an SOI layer is formed over a glass substrate, a structure is known in which a thin film of single-crystalline silicon having a covering film is formed over a glass substrate having a coating film by a hydrogen ion implantation separation method (see Reference 2: Japanese Published Patent Application No. 2004-134675). In this case also, the thin silicon layer (SOI layer) is formed over the glass substrate in such a way that a microbubble layer is formed at a predetermined depth from the surface by implantation of hydrogen ions to a single-crystalline silicon wafer, the glass substrate and the single-crystalline silicon wafer are bonded to each other, and the silicon wafer is separated using the microbubble layer as a cleavage plane.

SUMMARY OF THE INVENTION

A glass substrate is rectangular in shape and had a size of 300 mm×400 mm for the first generation in the beginning of 1990, which has grown to 680 mm×880 mm or 730 mm×920 mm for the fourth generation in 2000.

In contrast, the size of a semiconductor substrate is not so varied because the semiconductor substrate is manufactured by forming an ingot of 20 cm to 30 cm in diameter by a Czochralski method (a CZ method), and slicing the ingot with a diamond blade or the like so that the slice has a thickness of about 0.5 mm to 1.5 mm to make a circle wafer.

A silicon wafer is difficult to be increased in size compared to a glass substrate; thus, when the glass substrate to which the silicon wafer is bonded is increased in size, only one silicon wafer cannot cover the entire surface of the glass substrate. Accordingly, a plurality of wafers is needed to be bonded to one substrate, and a gap is generated between one silicon wafer and another silicon wafer or a region where the wafers overlap with each other is generated. An active layer cannot be provided in the gap or the region where the silicon wafers overlap with each other; therefore, there is a limitation on a design of a circuit.

In view of the above problems, it is an object of the present invention to provide a method for manufacturing a semiconductor substrate in which the size of a gap formed between single-crystalline semiconductor layers can be reduced, when a plurality of single-crystalline semiconductor layers separated from a plurality of single-crystalline semiconductor substrates is bonded to a large-sized substrate, and a semiconductor substrate which is manufactured by the method.

One aspect of the present invention is a method for manufacturing a semiconductor substrate by forming a plurality of single-crystalline semiconductor layers which is separated from a plurality of single-crystalline semiconductor substrates over a substrate having an insulating surface. In this method, a first single-crystalline semiconductor substrate is bonded to a substrate having an insulating surface, the first single-crystalline semiconductor substrate is separated such that a first single-crystalline semiconductor layer is left remaining over the substrate having an insulating surface, a second single-crystalline semiconductor substrate is bonded to the substrate having an insulating surface so as to overlap with at least part of the first single-crystalline semiconductor layer provided over the substrate having an insulating surface, and the second single-crystalline semiconductor substrate is separated such that a second single-crystalline semiconductor layer is left remaining over the substrate having an insulating surface.

In addition, according to another aspect of the present invention, in a method for manufacturing a semiconductor substrate, a plurality of single-crystalline semiconductor layers is provided over a substrate having an insulating surface, a resist is formed so as to cover the plurality of single-crystalline semiconductor layers, and laser irradiation is performed from the side of the substrate having an insulating surface so that the resist is exposed to light. Here, when the resist is exposed to light, laser light of a given wavelength is used. The laser light of such a wavelength is transmitted through a region provided with one single-crystalline semiconductor layer, and is not transmitted through a region provided with the plurality of single-crystalline semiconductor layers, or intensity of the laser light is not high enough to expose the resist to light even if the laser light is transmitted through the region provided with the plurality of single-crystalline semiconductor layers; accordingly, the resist can be exposed to light as selected.

According to the method for manufacturing a semiconductor substrate of the present invention, a semiconductor substrate can be manufactured, in which the size of a gap formed between a plurality of single-crystalline semiconductor layers is reduced, when the plurality of single-crystalline semiconductor layers is separated from a plurality of single-crystalline semiconductor substrates and bonded to a large-sized substrate. Therefore, a region where an active layer is not provided can be reduced in the large-sized substrate, so that flexibility in designing a circuit can be improved.

DETAILED DESCRIPTION OF THE INVENTION

Embodiment Modes of the present invention will be hereinafter described with reference to the accompanying drawings. Note that the present invention can be implemented in various modes, and it is easily understood by those skilled in the art that modes and details thereof can be modified in various ways without departing from the spirit and the scope of the present invention. Accordingly, the present invention should not be interpreted as being limited to the description of the embodiment modes.

Embodiment Mode 1

Figure 1:
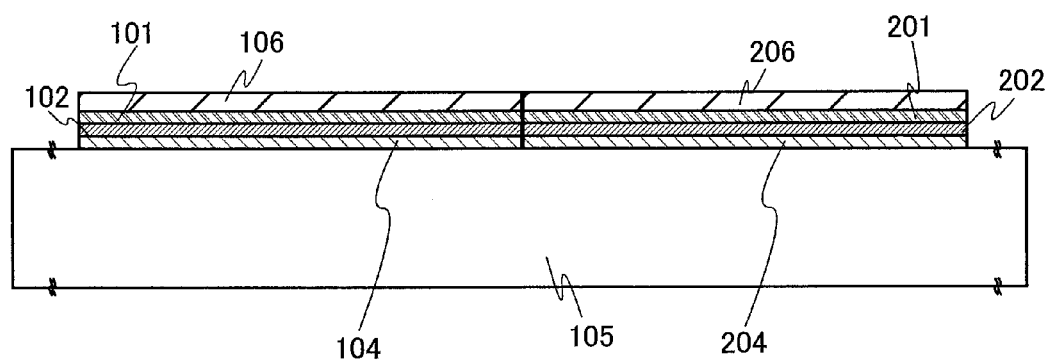
FIG. 1 is a cross-sectional view showing a structure of a semiconductor substrate of the present invention.

FIG. 1 shows a semiconductor substrate according to the present invention. In FIG. 1, a base substrate 105 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. Alternatively, a quartz glass substrate or a semiconductor substrate such as a silicon wafer can be used. For first and second single-crystalline semiconductor layers 106 and 206, single-crystalline silicon can be used, for example. Alternatively, silicon or germanium which can be separated from a single-crystalline semiconductor substrate or a polycrystalline semiconductor substrate by a hydrogen ion implantation separation method can be used, or a crystalline semiconductor layer formed of a compound semiconductor such as gallium arsenide or indium phosphide can be used. In this embodiment mode, a silicon wafer of 5 in.×5 in. is used as the single-crystalline semiconductor substrate.

A first bonding layer 104 which has a smooth surface and forms a hydrophilic surface is provided between the base substrate 105 and the first single-crystalline semiconductor layer 106, and a second bonding layer 204 which has a smooth surface and forms a hydrophilic surface is provided between the base substrate 105 and the second single-crystalline semiconductor layer 206. A silicon oxide film is suitable for each of the first bonding layer 104 and the second bonding layer 204. In particular, a silicon oxide film formed by a chemical vapor deposition method using organic silane as a source gas is preferable. As the organic silane, a compound containing silicon such as the following can be used: tetraethoxysilane (TEOS) (chemical formula: $Si(OC_2H_5)_4$); trimethylsilane (TMS) (chemical formula: $(CH_3)_3SiH$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); or trisdimethylaminosilane (chemical formula: $SiH(N(CH_3)_2)_3$).

In addition, in FIG. 1, insulating layers containing nitrogen are provided as barrier layers between the first single-crystalline semiconductor layer 106 and the first bonding layer 104 and between the second single-crystalline semiconductor layer 206 and the second bonding layer 204. In this embodiment mode, as the insulating layers containing nitrogen, a first silicon oxynitride layer 101, a second silicon oxynitride layer 201, a first silicon nitride oxide layer 102, and a second silicon nitride oxide layer 202 are provided. The first bonding layer 104 and the second bonding layer 204 are provided in order to form a bond with the base substrate 105, and the insulating layers containing nitrogen are preferably provided in order to prevent impurities such as mobile ions or moisture from diffusing into and contaminating the first single-crystalline semiconductor layer 106 and the second single-crystalline semiconductor layer 206.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride layer or the silicon nitride oxide layer is defined as 100 at. %.

In FIG. 1, the first single-crystalline semiconductor layer 106 and the second single-crystalline semiconductor layer 206 are separated from a plurality of single-crystalline semiconductor substrates and bonded to the base substrate 105, and the size of a gap formed between the single-crystalline semiconductor layers can be reduced.

Hereinafter, an example of a method for manufacturing a semiconductor substrate of the present invention will be described with reference to FIGS. 2A to 2C, FIGS. 3A and 3B, FIGS. 4A to 4C, FIGS. 5A to 5C, and FIGS. 6A and 6B.

Figure 2A:
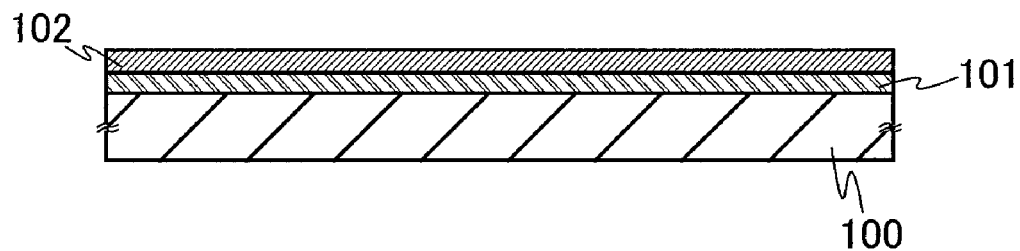
FIGS. 2A to 2C are explanatory cross-sectional views of a method for manufacturing a semiconductor substrate of the present invention.

First, as shown in FIG. 2A, the first silicon oxynitride layer 101 and the first silicon nitride oxide layer 102 are formed each with a thickness of from 50 nm to 100 nm over a first single-crystalline semiconductor substrate 100 by use of a plasma CVD apparatus.

Figure 2B:
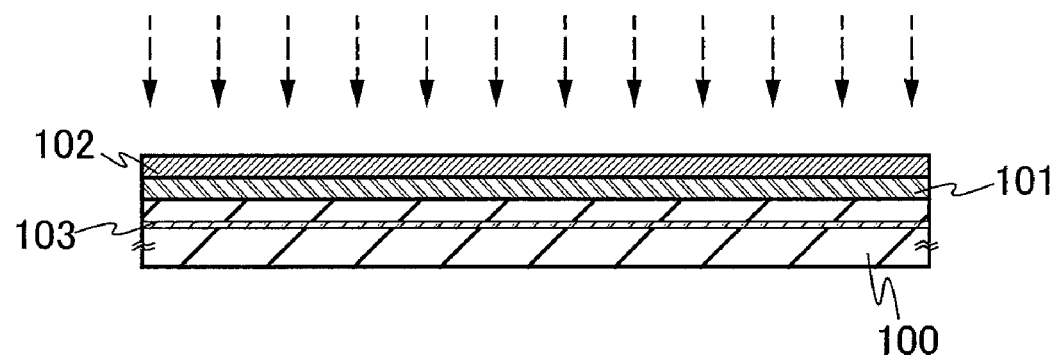

Next, as shown in FIG. 2B, irradiation with hydrogen ions is performed from the upper surface of the first single-crystalline semiconductor substrate 100 at about $1.0 \times 10^{16}$ ions/cm² to $3.0 \times 10^{16}$ ions/cm² by use of an ion doping apparatus, so that a first brittle layer (ion-implanted layer) 103 is formed. Irradiation with hydrogen ions is performed in consideration of a thickness of a single-crystalline semiconductor layer which is transferred to the base substrate. An acceleration voltage of ions is controlled so that a thickness of the single-crystalline semiconductor layer is from 5 nm to 500 nm, preferably, from 10 nm to 200 nm.

In the method for manufacturing a semiconductor substrate of the present invention, the first silicon nitride oxide layer 102 is formed over the surface irradiated with ions and functions as a protection film against addition of ions, so that roughness of the surface of the first single-crystalline semiconductor substrate 100 due to addition of ions can be prevented.

Figure 2C:
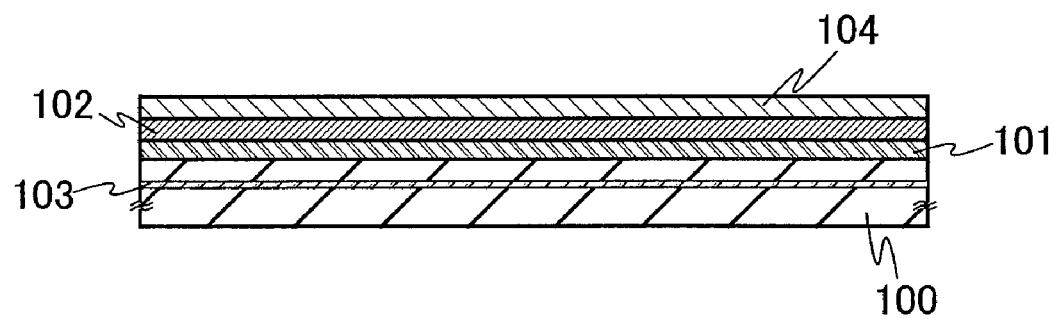

Next, as shown in FIG. 2C, the first bonding layer 104 which forms a bond with the base substrate is formed. As the first bonding layer 104, a silicon oxide film is preferably formed by a chemical vapor deposition method using an organic silane gas as described above. Alternatively, a silicon oxide film formed by a chemical vapor deposition method using a silane gas can also be used. In the film formation by a chemical vapor deposition method, a film formation temperature of, for example, less than or equal to 350° C. is employed so that degassing of hydrogen ions which are added to the first single-crystalline semiconductor substrate 100 is not caused.

Figure 3A:
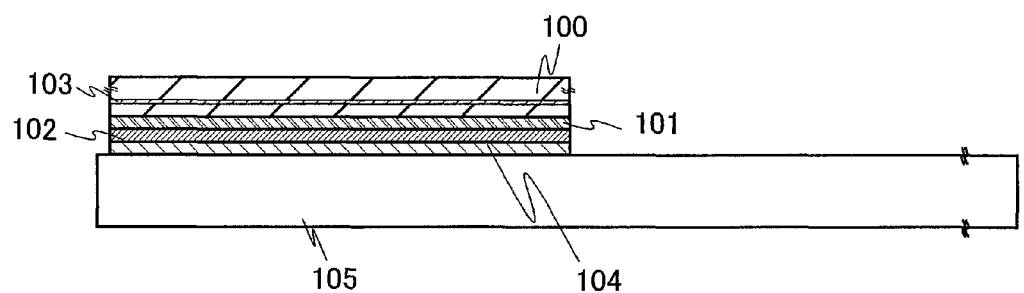
FIGS. 3A and 3B are explanatory cross-sectional views of the method for manufacturing the semiconductor substrate of the present invention.

FIG. 3A shows a mode in which the base substrate 105 is disposed in close contact with the first bonding layer 104 formed over the first single-crystalline semiconductor substrate 100, and the base substrate 105 and the bonding layer 104 are bonded to each other. Surfaces which are to form a bond are cleaned sufficiently. By disposing the base substrate 105 in close contact with the first bonding layer 104, a bond is formed therebetween. This bond is made by Van der Waals forces. By applying pressure to the base substrate 105 and the first single-crystalline semiconductor substrate 100, a stronger bond can be formed by hydrogen bond.

In order to form a favorable bond, the surfaces may be activated. For example, the surfaces that form a bond are irradiated with an atomic beam or an ion beam. In the case of utilizing the atomic beam or the ion beam, an inert gas neutral atomic beam or an inert gas ion beam of argon or the like can be used. Alternatively, plasma irradiation or radical treatment may be performed. Such surface treatment makes it easy to form a bond between different kinds of materials even if temperature is at from 200° C. to 400° C.

After the base substrate 105 and the first single-crystalline semiconductor substrate 100 are bonded to each other with the first bonding layer 104 interposed therebetween, heat treatment or pressure treatment is preferably performed. Heat treatment or pressure treatment makes it possible to increase the bond strength. It is preferable that the temperature for heat treatment be less than or equal to the upper temperature limit of the base substrate 105. The pressure treatment is performed so that pressure is applied perpendicularly to the bonding surface, in consideration of the pressure resistance of the base substrate 105 and the first single-crystalline semiconductor substrate 100.

Figure 3B:
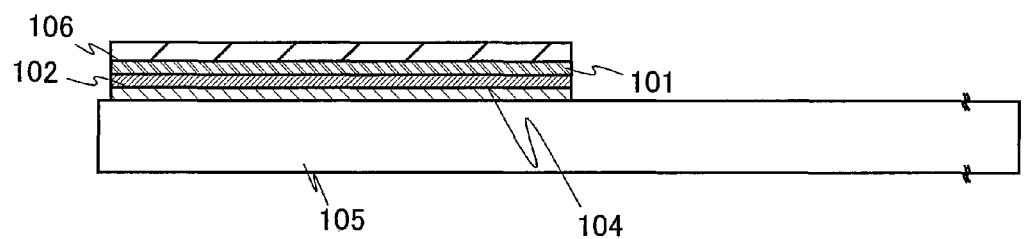

Then, as shown in FIG. 3B, heat treatment is performed, and part of the first single-crystalline semiconductor substrate 100 is separated from the base substrate 105 using the first brittle layer 103 as a separation plane (cleavage plane). The heat treatment is preferably performed at a temperature ranging from the temperature at which the first bonding layer 104 is formed to the upper temperature limit of the base substrate 105. When the heat treatment is performed at, for example, from 400° C. to 600° C., a change in the volume of fine voids occurs in the hydrogen ions added to the first single-crystalline semiconductor substrate 100, so that the first single-crystalline semiconductor substrate 100 can be separated along the first brittle layer 103. Because the first bonding layer 104 is bonded to the base substrate 105, a first single-crystalline semiconductor layer 106 having the same crystallinity as that of the first single-crystalline semiconductor substrate 100 is left remaining over the base substrate 105. In this embodiment mode, the heat treatment is performed at 600° C. for 1 to 2 hours, and a thickness of the first single-crystalline semiconductor layer 106 is set to be about 200 nm. By reusing the first single-crystalline semiconductor substrate 100 which is separated from the base substrate 105, the cost can be reduced.

Figure 4A:
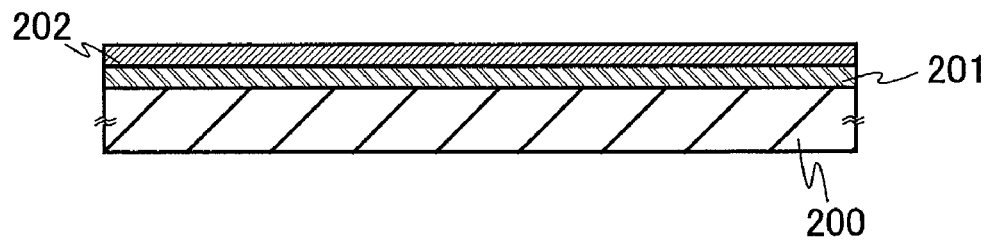
FIGS. 4A to 4C are explanatory cross-sectional views of the method for manufacturing the semiconductor substrate of the present invention.

In a similar manner, the second silicon oxynitride layer 201 and the second silicon nitride oxide layer 202 are formed each with a thickness of from 50 nm to 100 nm over a second single-crystalline semiconductor substrate 200 by use of a plasma CVD apparatus (FIG. 4A). The second single-crystalline semiconductor substrate 200 is formed using the same material as that of the first single-crystalline semiconductor substrate 100.

Figure 4B:
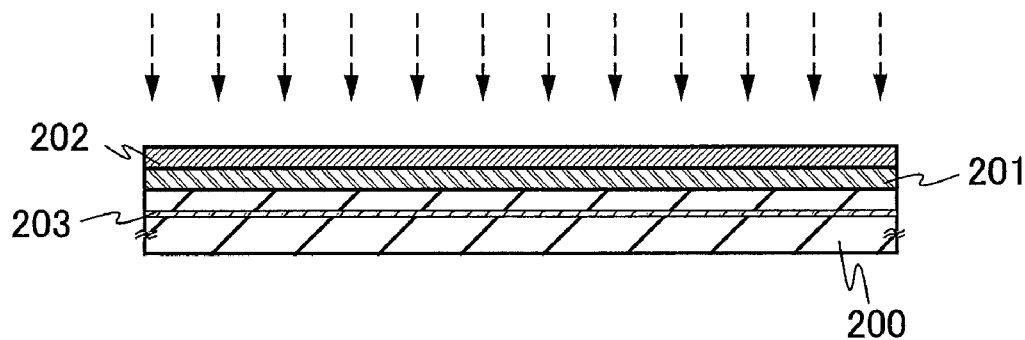

Next, irradiation with hydrogen ions is performed at about $1.0 \times 10^{16}$ ions/cm² to $3.0 \times 10^{16}$ ions/cm² by use of an ion doping apparatus, so that a second brittle layer 203 is formed (FIG. 4B). In the ion irradiation, an acceleration voltage of ions is controlled so that the thickness of a single-crystalline semiconductor layer which is transferred to the base substrate is the same as that of the first single-crystalline semiconductor layer.

Figure 4C:
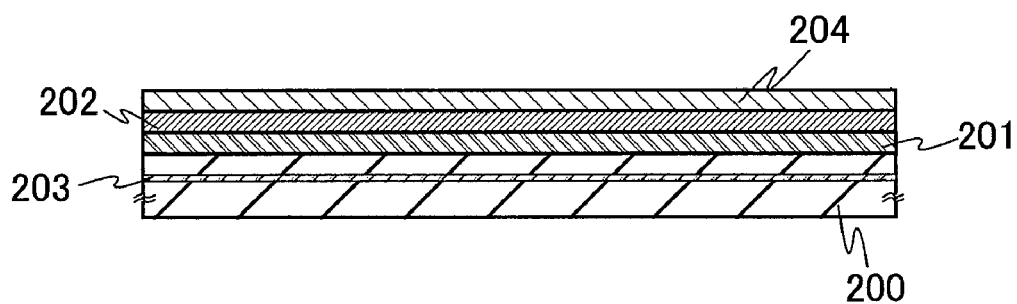

Next, in a similar manner to the step shown in FIG. 2C, the second bonding layer 204 which forms a bond with the base substrate is formed (FIG. 4C). As the second bonding layer 204, a silicon oxide film is preferably formed by a chemical vapor deposition method using an organic silane gas as described above. Note that the process up to formation of the second bonding layer 204 over the second single-crystalline semiconductor substrate 200 may be performed at the same time as the process up to formation of the first bonding layer 104 over the first single-crystalline semiconductor substrate 100.

Each of the first bonding layer 104 and the second bonding layer 204 which has a smooth surface and forms a hydrophilic surface is provided with a thickness of from 5 nm to 500 nm. With this thickness, it is possible to smooth roughness of a surface where the bonding layer is to be formed and also to ensure smoothness of a growing surface of the bonding layer. In addition, it is possible to mitigate distortion with the substrate to which the bonding layer is to be bonded.

Figure 5A:
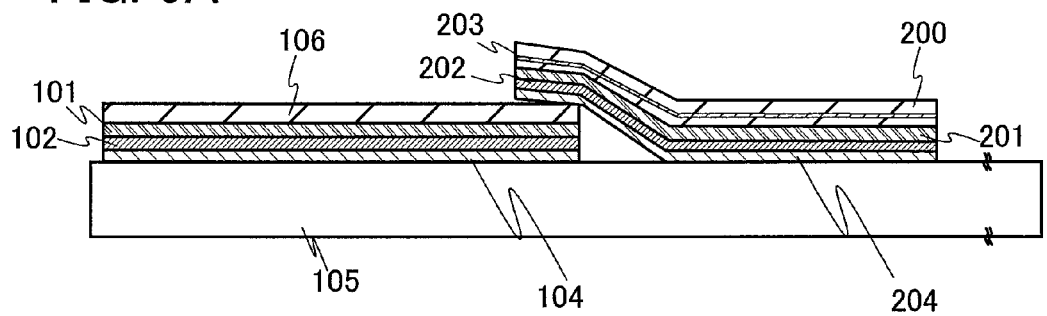
FIGS. 5A to 5C are explanatory cross-sectional views of the method for manufacturing the semiconductor substrate of the present invention.

Next, as shown in FIG. 5A, the second single-crystalline semiconductor substrate 200 and the base substrate 105 provided with the first single-crystalline semiconductor layer 106 are bonded to each other. After that, as in the case where the first single-crystalline semiconductor substrate 100 is bonded, heat treatment is performed, and part of the second single-crystalline semiconductor substrate 200 is separated from the base substrate 105 using the second brittle layer 203 as a separation plane, so that a second single-crystalline semiconductor layer 206 is formed. In this embodiment mode, the heat treatment is performed at 600° C. for 1 to 2 hours, and a thickness of the second single-crystalline semiconductor layer 206 is set to be about 200 nm. By reusing the second single-crystalline semiconductor substrate 200 which is separated from the base substrate 105, the cost can be reduced.

As shown in FIG. 5A, the second single-crystalline semiconductor substrate 200 is bonded to the base substrate 105 such that the first single-crystalline semiconductor layer 106 which has been bonded in advance and the second single-crystalline semiconductor layer 206 at least partially overlap with each other at the boundary; preferably, one side of the first single-crystalline semiconductor layer 106 and one side of the second single-crystalline semiconductor layer 206 are made to overlap with each other by about several μm to several cm. Thus, it is possible to reduce the size of a gap formed between a plurality of single-crystalline semiconductor layers, when the plurality of single-crystalline semiconductor layers is bonded to the base substrate from a plurality of single-crystalline semiconductor substrates. The range of a region in which the second single-crystalline semiconductor substrate 200 and the base substrate 105 are bonded to each other may be adjusted as appropriate in consideration of the size of the second single-crystalline semiconductor substrate 200, the bond strength between the second single-crystalline semiconductor substrate 200 and the base substrate 105, and the like.

In the case where a plurality of the first single-crystalline semiconductor substrates 100 and a plurality of the second single-crystalline semiconductor substrates 200 are bonded to the base substrate 105, the first single-crystalline semiconductor substrates 100 and the second single-crystalline semiconductor substrates 200 are preferably bonded in a so-called checkered pattern.

Before the second single-crystalline semiconductor substrate 200 is bonded, the surface of the first single-crystalline semiconductor layer 106 is preferably subjected to chemical mechanical polishing (CMP) so as to be planarized. Alternatively, the surface of the first single-crystalline semiconductor layer 106 may be irradiated with laser light so as to be planarized without the use of physical polishing means such as CMP. Note that the laser irradiation is preferably performed in a nitrogen atmosphere having an oxygen concentration of less than or equal to 10 ppm. This is because laser irradiation in an oxygen atmosphere may make the surface of the first single-crystalline semiconductor layer 106 rough.

Figure 5B:
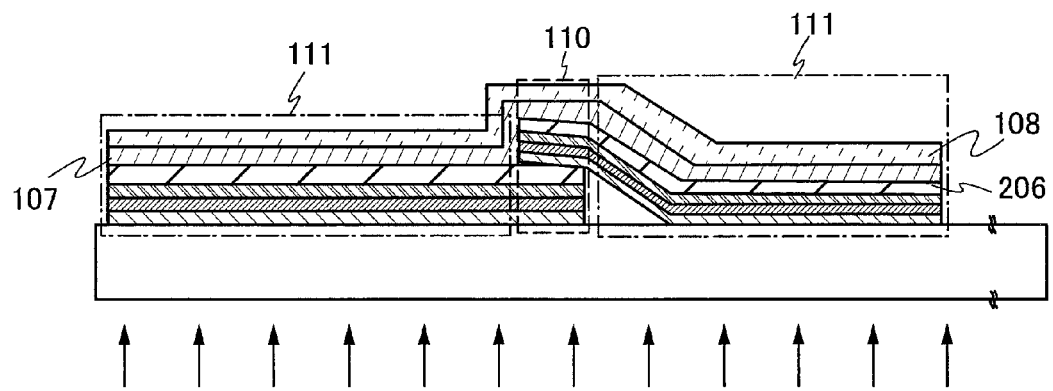

Then, as shown in FIG. 5B, a silicon oxide layer 107 is formed over the first single-crystalline semiconductor layer 106 and the second single-crystalline semiconductor layer 206. After formation of the silicon oxide layer 107, a resist 108 is applied on the silicon oxide layer 107 and exposed to light from the base substrate 105 side.

In order to expose the resist to light, laser light of a given wavelength is used. The laser light of such a wavelength is transmitted through a region 111 provided with one single-crystalline semiconductor layer having a thickness d, but is not transmitted through a region 110 provided with a plurality of single-crystalline semiconductor layers, or intensity of the laser light is not high enough to expose the resist to light even if the laser light is transmitted through the region 110. Specifically, laser light having the following condition may be selected: when the wavelength of the laser light used for irradiation is represented by $\lambda$ and an extinction coefficient of the single-crystalline semiconductor layer is represented by k, the thickness d of the single-crystalline semiconductor layer and a penetration length (also referred to as a penetration depth or a skin depth) $\delta$ of the laser light satisfy $d \leq \delta < 5d$ ($\delta = \lambda/4\pi k$), preferably, $d \leq \delta < 2d$ ($\delta = \lambda/4\pi k$).

With the use of the laser light having a penetration length in the above range, in the region 111 provided with one single-crystalline semiconductor layer, the laser light is transmitted through the single-crystalline semiconductor layer, and the resist 108 is exposed to light. On the other hand, in the region 110 provided with a plurality of the single-crystalline semiconductor layers (that is, the total thickness of the single-crystalline semiconductor layers is greater than or equal to 2d), the laser light is not transmitted through the single-crystalline semiconductor layers, or intensity of the laser light is not high enough to expose the resist 108 to light even if the laser light is transmitted through the single-crystalline semiconductor layers, so that the resist 108 is not exposed to light. Therefore, the resist 108 can be patterned in a self-alignment manner.

Further, the laser light used for exposure of the resist may have such a wavelength that the difference between intensity of the laser light which has been transmitted though one single-crystalline semiconductor layer and intensity of the laser light which has been transmitted through two single-crystalline semiconductor layers is greater than or equal to 20%, preferably, greater than or equal to 50%. When the resist is exposed to such laser light, by adjusting intensity of the laser light used for irradiation as appropriate, it can be controlled whether the resist is exposed to light or not in accordance with the number of single-crystalline semiconductor layers, so that the resist can be patterned in a self-alignment manner.

Light intensity I, in the case where the single-crystalline semiconductor layer is irradiated with laser light and the laser light travels in a depth direction in the single-crystalline semiconductor layer by a distance z, is represented by the following equation (1) according to Lambert's law: $I = I(0) \cdot \exp(-\alpha z)$. $I(0)$ denotes irradiation light intensity. $\alpha$ denotes a light absorption coefficient and can be obtained by $\alpha = 4\pi k/\lambda$. The intensity $I_1$ of light which has been transmitted through one single-crystalline semiconductor layer with a thickness d is represented by the following equation (2): $I_1 = I(0) \cdot \exp(-\alpha \cdot d)$. Further, the intensity $I_2$ of light which has been transmitted through two single-crystalline semiconductor layers each with a thickness d is represented by the following equation (3): $I_2 = I(0) \cdot \exp(-\alpha \cdot 2d)$.

Therefore, when the difference between the intensity of light which has been transmitted through one single-crystalline semiconductor layer and the intensity of light which has been transmitted through two or more single-crystalline semiconductor layers is made to be greater than or equal to 20%, laser light of a wavelength $\lambda$ which satisfies the following inequality (4) may be selected: $\exp(-\alpha \cdot d)/\exp(-\alpha \cdot 2d) \geq 1.2$ ($\alpha = 4\pi k/\lambda$). Further, when the difference is made to be greater than or equal to 50%, laser light of a wavelength $\lambda$ which satisfies the following inequality (5) may be selected: $\exp(-\alpha \cdot d)/\exp(-\alpha \cdot 2d) \geq 1.5$ ($\alpha = 4\pi k/\lambda$).

A laser light source is not limited to a particular type as long as it emits light of the above wavelength; for example, a pulsed laser apparatus (pulsed laser) such as an Nd:YVO$_4$ laser or an Nd:YFL laser, a gas laser such as an Ar laser, a continuous wave laser apparatus (CW laser) such as an Nd:YAG laser, or the like can be used. In addition, a light source is not limited to the laser apparatus, and for example, a mercury lamp, a metal halide lamp, or the like may also be used.

Figure 7:
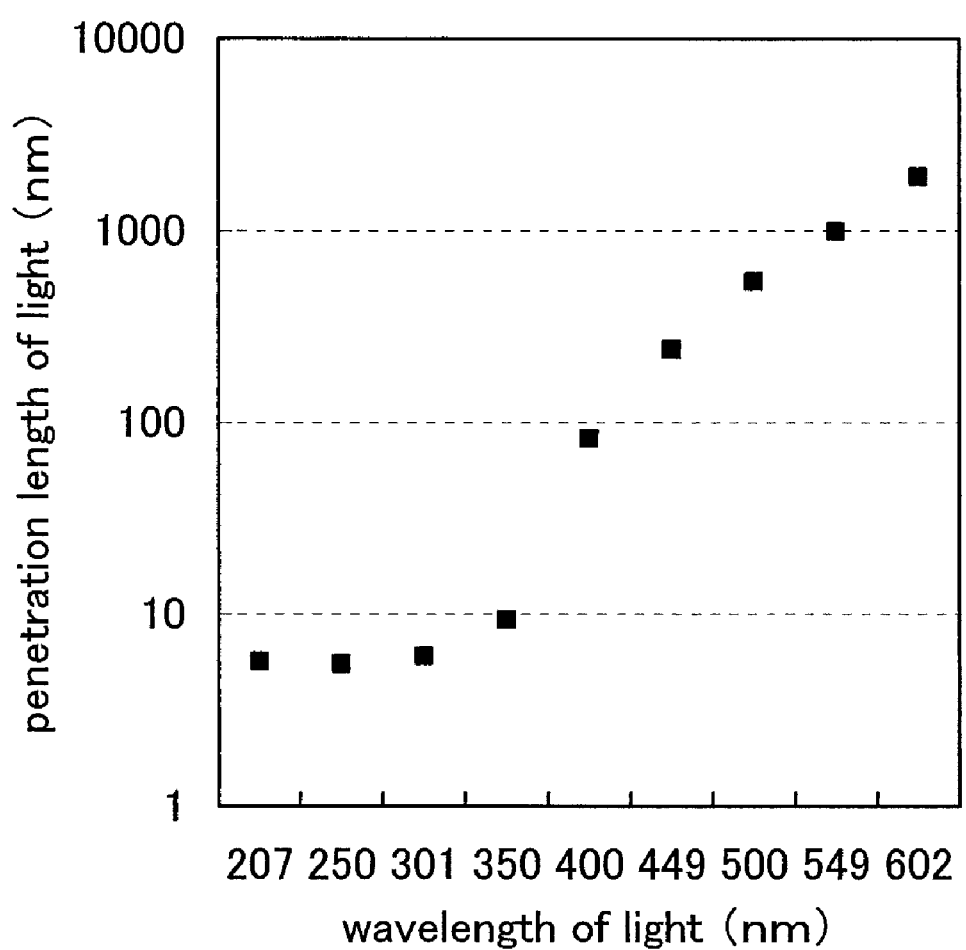
FIG. 7 is a graph showing a relation between a penetration length and a wavelength of light in single-crystalline silicon.

In this embodiment mode, a single-crystalline silicon layer is formed as the single-crystalline semiconductor layer. Table 1 shows an extinction coefficient $k_{Si}$ and a penetration length $\delta_{Si}$ of light at a typical wavelength in single-crystalline silicon. Also, FIG. 7 is a graph showing a relation between a wavelength (nm) and a penetration length (nm) of light in single-crystalline silicon which are shown in Table 1. In FIG. 7, the vertical axis represents a penetration length (nm) of light in the single-crystalline silicon layer and the horizontal axis represents a wavelength (nm) of light.

TABLE 1

| wavelength λ (nm) | extinction coefficient $k_{Si}$ | penetration length $\delta_{Si}$(nm) |
|---|---|---|
| 206.6 | 2.91 | 5.65 |
| 250 | 3.63 | 5.48 |
| 300.9 | 3.98 | 6.02 |
| 350.2 | 2.99 | 9.32 |
| 400 | 0.39 | 82.3 |
| 449.2 | 0.15 | 240 |
| 499.9 | 0.073 | 545 |
| 548.6 | 0.044 | 992 |
| 601.9 | 0.025 | 1916 |
| 645.8 | 0.017 | 3023 |
| 696.5 | 0.013 | 4264 |
| 746.9 | 0.009 | 6604 |
| 805.1 | 0.006 | 10678 |
| 826.6 | 0.005 | 13156 |

In this embodiment mode, the resist 108 is exposed to light using the second harmonic of an Nd:YVO$_4$ laser of a wavelength of 532 nm. Since the single-crystalline semiconductor layer is formed with a thickness of 200 nm in this embodiment mode, $d \leq \delta < 5d$ ($\delta = \lambda/4\pi k$) is satisfied according to Table 1 and FIG. 7. Further, since the extinction coefficient $k_{Si}$ at a wavelength of 532 nm is about 0.044, the value of exp(−α·d)/exp(−α·2d) is about 1.2. Therefore, the resist 108 can be patterned in a self-alignment manner by being irradiated with laser light of a wavelength of 532 nm.

Figure 5C:
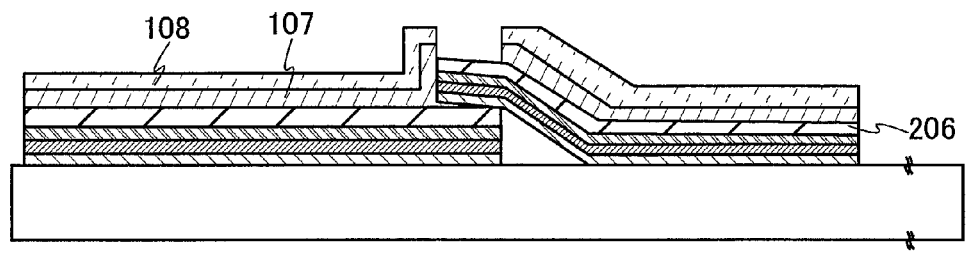

Next, as shown in FIG. 5C, the silicon oxide layer 107 in a region where the first single-crystalline semiconductor layer 106 and the second single-crystalline semiconductor layer 206 overlap with each other (hereinafter, the overlap region) is etched with hydrofluoric acid by using the patterned resist as a mask. Further, the second single-crystalline semiconductor layer 206 in the overlap region can be etched by dry etching using the second silicon oxynitride layer 201 as an etching stopper. The silicon oxide layer 107 is formed so as to prevent contamination due to impurities from the resist 108 to the single-crystalline semiconductor layer and may also be formed of a silicon nitride layer or the like instead of the silicon oxide layer.

Figure 6A:
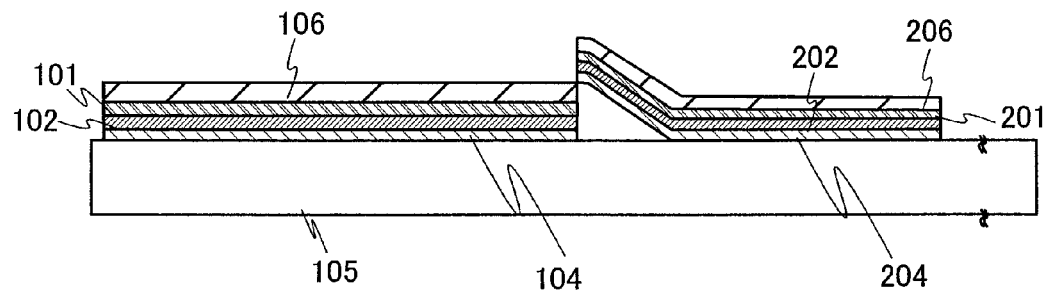
FIGS. 6A and 6B are explanatory cross-sectional views of the method for manufacturing the semiconductor substrate of the present invention.

After removal of the resist 108, as shown in FIG. 6A, the second silicon oxynitride layer 201, the second silicon nitride oxide layer 202, and the second bonding layer 204 in the overlap region are etched with hydrofluoric acid.

Figure 6B:
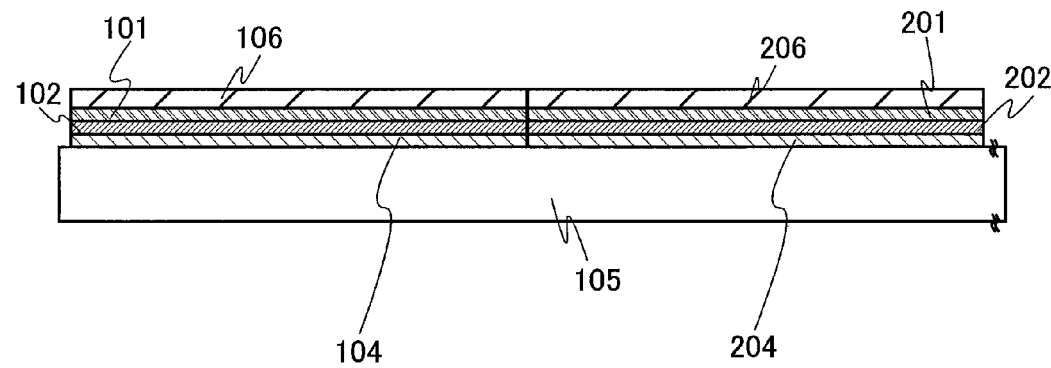

Then, heat treatment is performed at about 600° C. By utilizing expansion of the glass substrate which is used as the base substrate, a region of the second bonding layer 204 which is apart from the base substrate 105 is bonded to the base substrate 105, so that the first single-crystalline semiconductor layer 106 and the second single-crystalline semiconductor layer 206 in the overlap region are joined (FIG. 6B). After the first single-crystalline semiconductor layer 106 and the second single-crystalline semiconductor layer 206 are joined, pressure treatment is preferably performed. Further, CMP may be performed so as to planarize the surfaces of the first and second single-crystalline semiconductor layers. Alternatively, the surfaces of the single-crystal semiconductor layers may be irradiated with laser light so as to be planarized without the use of physical polishing means such as CMP. As described above, a semiconductor substrate of the present invention can be manufactured.

In the method for manufacturing a semiconductor substrate of the present invention, as a base substrate to which the single-crystalline semiconductor substrates are bonded, it is possible to use any of a variety of glass substrates that are used in the electronics industry and that are referred to as non-alkaline glass substrates, such as an aluminosilicate glass substrate, an aluminoborosilicate glass substrate, and a barium borosilicate glass substrate. In other words, single-crystalline semiconductor layers can be formed over a substrate that is longer than one meter on each side. Accordingly, with the use of a large-sized substrate, not only a display device such as a liquid crystal display but also a semiconductor integrated circuit can be manufactured.

In addition, in the method for manufacturing a semiconductor substrate of the present invention, when a plurality of single-crystalline semiconductor layers is bonded to a large-sized substrate from a plurality of single-crystalline semiconductor substrates, the size of a gap formed between the single-crystalline semiconductor layers can be reduced. Therefore, single-crystalline semiconductor layers with high mobility can be formed over approximately the entire surface of a glass substrate; thus, flexibility in designing a circuit can be improved.

Embodiment Mode 2

This embodiment mode will describe an example of a method for manufacturing a semiconductor substrate having a different structure from that in the preceding embodiment mode with reference to the drawings. Note that description of the same structure as that in Embodiment Mode 1 is simplified and partially omitted.

An example of a method for manufacturing a semiconductor substrate according to this embodiment mode will now be described with reference to FIGS. 8A to 8D, FIGS. 9A to 9C, and FIGS. 10A and 10B.

First, in a similar manner to the manufacturing process described in Embodiment Mode 1 with reference to FIGS. 2A to 2C and FIGS. 3A and 3B, a first silicon oxynitride layer 101 and a second silicon nitride oxide layer 102 are formed each with a thickness of from 50 nm to 100 nm over a first single-crystalline semiconductor substrate 100 by use of a plasma CVD apparatus. Next, irradiation with hydrogen ions is performed from the upper surface of the first single-crystalline semiconductor substrate 100 at about $1.0 \times 10^{16}$ ions/cm$^2$ to $3.0 \times 10^{16}$ ions/cm$^2$ by use of an ion doping apparatus, so that a first brittle layer is formed.

Then, a first bonding layer 104 is formed over a surface which forms a bond with a base substrate. As the first bonding layer 104, a silicon oxide film is preferably formed by a chemical vapor deposition method using an organic silane gas as described above.

Then, after the base substrate 105 and the first single-crystalline semiconductor substrate 100 are bonded to each other, heat treatment is performed, so that part of the first single-crystalline semiconductor substrate 100 is separated from the base substrate 105 using the first brittle layer 103 as a separation plane; thus, a first single-crystalline semiconductor layer 106 is formed. Note that the process up to the formation of the first single-crystalline semiconductor layer 106 over the base substrate 105 is based on the process described in Embodiment Mode 1, so that its description is partially omitted.

Figure 8A:
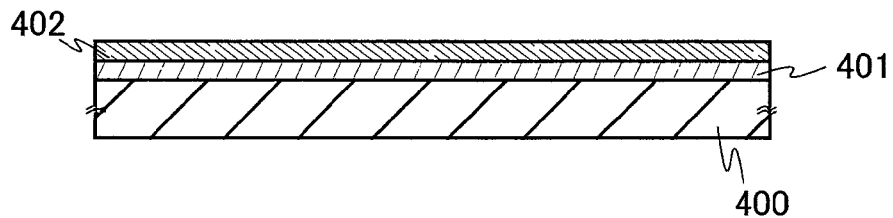
FIGS. 8A to 8D are explanatory cross-sectional views of a method for manufacturing a semiconductor substrate of the present invention.

Next, as shown in FIG. 8A, an insulating layer 401 is formed over a second single-crystalline semiconductor substrate 400, and a separation layer 402 is formed over the insulating layer 401. The insulating layer 401 is formed using an inorganic compound by a sputtering method, a plasma CVD method, a coating method, a printing method, or the like. As typical examples of the inorganic compound, silicon oxide, silicon nitride, silicon oxynitride, silicon nitride oxide, and the like can be given. In this embodiment mode, a silicon oxide film is formed as the insulating layer 401.

The separation layer 402 is formed by a sputtering method, a plasma CVD method, a coating method, a printing method, or the like using a single layer of an element selected from tungsten, molybdenum, titanium, tantalum, niobium, nickel, cobalt, zirconium, zinc, ruthenium, rhodium, palladium, osmium, iridium, and silicon, an alloy material containing any of the elements as it main component, or a compound material containing any of the elements as its main component, or a stacked layer of a plurality of these layers. The crystalline structure of a layer containing silicon may be amorphous, microcrystalline, or polycrystalline. Here, a coating method means a method in which a solution is discharged to an object so that a film is formed, and includes, for example, a spin coating method and a droplet discharging method. Further, a droplet discharging method is a method in which droplets of a composition that contains fine particles are discharged through a minute hole to form a pattern with a predetermined shape.

When the separation layer 402 has a single-layer structure, it is preferable to form a layer containing tungsten, molybdenum, or a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to, for example, an alloy of tungsten and molybdenum.

When the separation layer 402 has a layered structure, preferably, a metal layer is formed as a first layer, and a metal oxide layer is formed as a second layer. For example, a layer containing tungsten, molybdenum, or a mixture of tungsten and molybdenum is formed as the first layer, and a layer containing an oxide of tungsten, molybdenum, or a mixture of tungsten and molybdenum; a layer containing a nitride of tungsten, molybdenum, or a mixture of tungsten and molybdenum; a layer containing an oxynitride of tungsten, molybdenum, or a mixture of tungsten and molybdenum; or a layer containing a nitride oxide of tungsten, molybdenum, or a mixture of tungsten and molybdenum is formed as the second layer.

When the separation layer 402 has a layered structure in which a metal layer is formed as the first layer and a metal oxide layer is formed as the second layer, the layered structure may be formed by utilizing the following: a layer containing tungsten is formed as the metal layer, and an insulating layer made of an oxide is formed thereover, whereby a layer containing an oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone water, or the like.

Further, as the separation layer 402, a metal layer may be formed as the first layer, and a metal nitride layer or a metal oxynitride layer may be formed as the second layer. For example, a layer containing tungsten may be formed as the first layer, and then, a tungsten nitride layer or a tungsten oxynitride layer may be formed as the second layer.

Figure 8B:
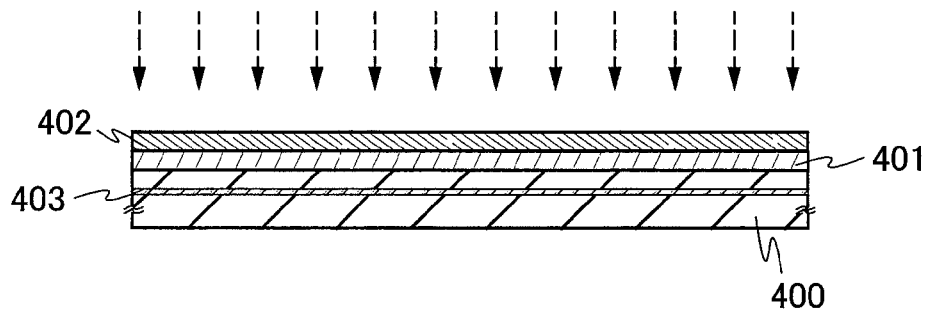

After that, as shown in FIG. 8B, the second single-crystalline semiconductor substrate 400 is irradiated with hydrogen ions at about $1.0 \times 10^{16}$ ions/cm$^2$ to $3.0 \times 10^{16}$ ions/cm$^2$ by use of an ion doping apparatus, so that a second brittle layer 403 is formed.

Figure 8C:
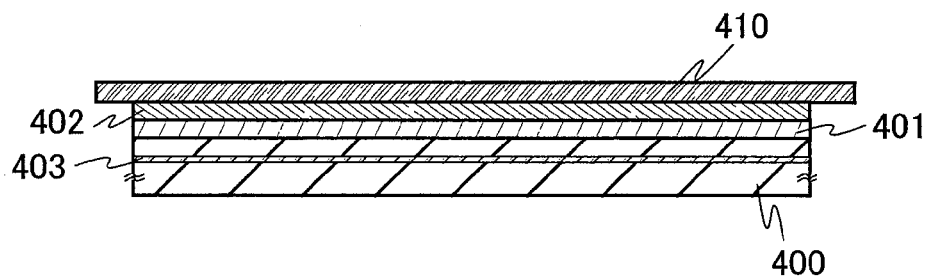

Next, a flexible substrate 410 is provided over the separation layer 402 (FIG. 8C). By performing thermocompression on the flexible substrate 410 and the separation layer 402, the flexible substrate 410 can be firmly attached to the separation layer 402. Alternatively, the flexible substrate 410 can be firmly attached to the separation layer 402 using an adhesive (not illustrated). Further alternatively, an insulating layer functioning as a bonding layer may be formed over the separation layer 402, and the flexible substrate 410 may be bonded to the separation layer 402 by heat treatment. As the flexible substrate, a substrate having heat resistance sufficient to withstand a processing temperature of the manufacturing process is preferable; for example, a flexible glass substrate, a flexible metal film, or the like can be used.

Next, heat treatment is performed, so that part of the second single-crystalline semiconductor substrate 400 is separated from the flexible substrate 410 using the second brittle layer 403 as a separation plane. The temperature of the heat treatment is set to be greater than or equal to a temperature at which the flexible substrate 410 and the separation layer 402 are pressure-bonded, and less than or equal to the upper temperature limit of the flexible substrate 410. Because the separation layer 402 is bonded to the flexible substrate 410, a second single-crystalline semiconductor layer 404 having the same crystallinity as that of the second single-crystalline semiconductor substrate 400 is left remaining over the flexible substrate 410. In this embodiment mode, a thickness of the second single-crystalline semiconductor layer 404 is made to be about 200 nm. By reusing the second single-crystalline semiconductor substrate 400 which is separated from the flexible substrate 410, the cost can be reduced.

After formation of the second single-crystalline semiconductor layer 404, the surface of the second single-crystalline semiconductor layer 404 is preferably planarized. As a planarizing method, CMP can be used. Alternatively, the surface of the second single-crystalline semiconductor layer 404 can be irradiated with laser light and melted to be planarized.

Figure 8D:
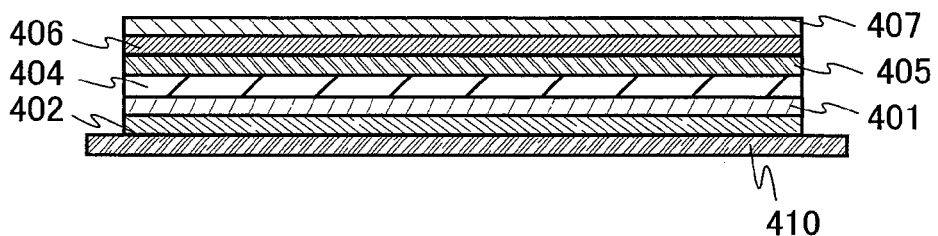

After that, a second silicon oxynitride layer 405 and a second silicon nitride oxide layer 406 are formed each with a thickness of from 50 nm to 100 nm over the second single-crystalline semiconductor layer 404 by use of a plasma CVD apparatus. Then, a second bonding layer 407 is formed over the second silicon nitride oxide layer 406 (FIG. 8D). As the second bonding layer 407, a silicon oxide film formed by a chemical vapor deposition method using an organic silane gas is preferable. Alternatively, a silicon oxide film formed by a chemical vapor deposition method using a silane gas can also be used.

Figure 9A:
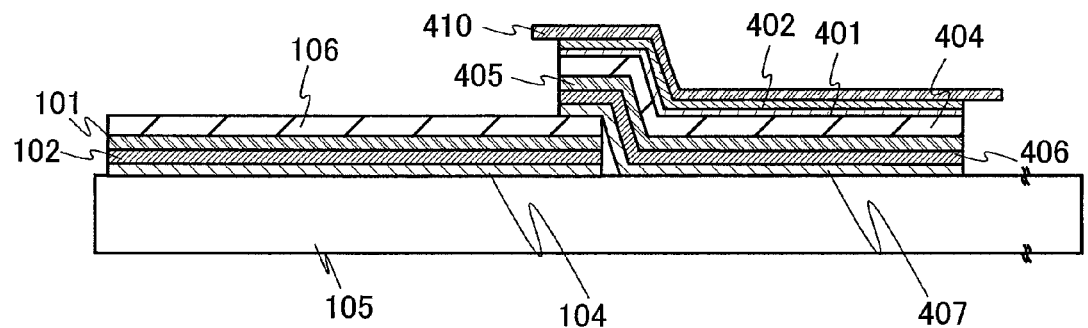
FIGS. 9A to 9C are explanatory cross-sectional views of the method for manufacturing the semiconductor substrate of the present invention.

Next, as shown in FIG. 9A, the base substrate 105 and the flexible substrate 410 are bonded to each other with the second bonding layer 407 interposed therebetween. Surfaces which are to form a bond are cleaned sufficiently. Then, by disposing the base substrate 105 in close contact with the second bonding layer 407, the bond is formed. This bond is made by Van der Waals forces. By pressing the base substrate 105 and the flexible substrate 410, a stronger bond can be formed by hydrogen bond.

After the base substrate 105 and the flexible substrate 410 are bonded to each other with the second bonding layer 407 interposed therebetween, heat treatment or pressure treatment is preferably performed to increase the bond strength. The heat treatment is preferably performed at a temperature less than or equal to the upper temperature limit of the flexible substrate 410 and the base substrate 105. The pressure treatment is performed so that pressure is applied perpendicularly to the bonding surface, in consideration of the pressure resistance of the base substrate 105 and the flexible substrate 410.

When the flexible substrate 410 is bonded to the base substrate 105, the first single-crystalline semiconductor layer 106 which has been bonded in advance and the second single-crystalline semiconductor layer 404 formed over the flexible substrate 410 at least partially overlap with each other at the boundary, preferably, one side of the first single-crystalline semiconductor layer 106 and one side of the second single-crystalline semiconductor layer 404 are made to overlap with each other by about several µm to several cm. Thus, it is possible to reduce the size of a gap formed between a plurality of single-crystalline semiconductor layers, when the plurality of single-crystalline semiconductor layers is bonded to the base substrate from a plurality of single-crystalline semiconductor substrates. A region in which the flexible substrate 410 and the base substrate are bonded to each other may be adjusted as appropriate in consideration of the size of the single-crystalline semiconductor layer 404, the bond strength between the flexible substrate 410 and the base substrate 105, and the like. In the case where a plurality of the first single-crystalline semiconductor substrates 100 and a plurality of the flexible substrates 410 are bonded to the base substrate 105, the first single-crystalline semiconductor substrates 100 and the flexible substrates 410 are preferably bonded in a so-called checkered pattern.

Next, the flexible substrate 410 is separated from the base substrate 105 along the separation layer 402 as an interface by physical means. Alternatively, the separation layer 402 is removed by etching, so that the flexible substrate 410 is separated from the base substrate 105. Here, separation occurs at any of the interface between the separation layer 402 and the insulating layer 401, inside of the separation layer 402, or the interface between the flexible substrate 410 and the separation layer 402, so that the flexible substrate 410 can be separated from the base substrate 105. Note that before the flexible substrate 410 is separated from the base substrate 105 along the separation layer 402, treatment may be performed so that the separation can be easily performed. In this embodiment mode, the separation layer 402 is removed by etching.

Figure 9B:
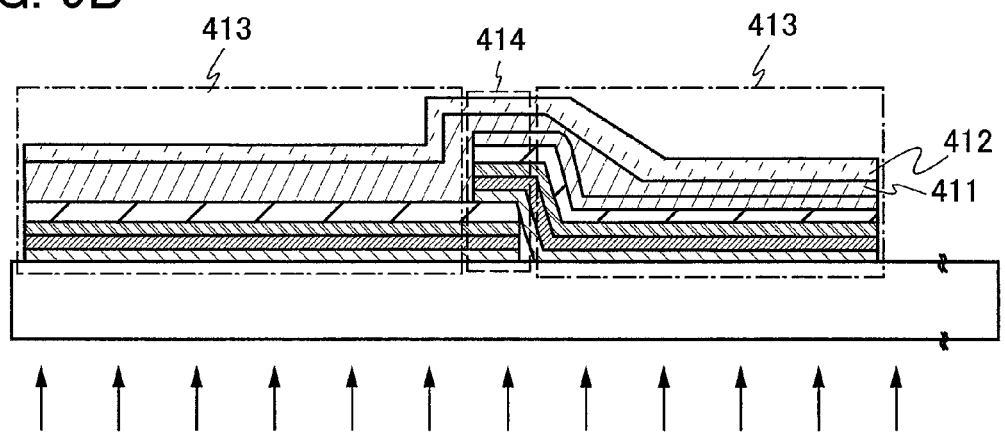

Then, as shown in FIG. 9B, a silicon oxide layer 411 is formed over the first single-crystalline semiconductor layer 106, the insulating layer 401, and the second single-crystalline semiconductor layer 404. After formation of the silicon oxide layer 411, a resist 412 is applied on the silicon oxide layer 411 and exposed to light from the base substrate 105 side.

When the resist is exposed to light, in a similar manner to that described in Embodiment Mode 1, laser light of a given wavelength is used. The laser light of such a wavelength is transmitted through a region 413 provided with one single-crystalline semiconductor layer, but is not transmitted through a region 414 provided with a plurality of single-crystalline semiconductor layers, or intensity of the laser light is not high enough to expose the resist to light even if the laser light is transmitted through the region 414. Therefore, the resist 412 can be patterned in a self-alignment manner.

Figure 9C:
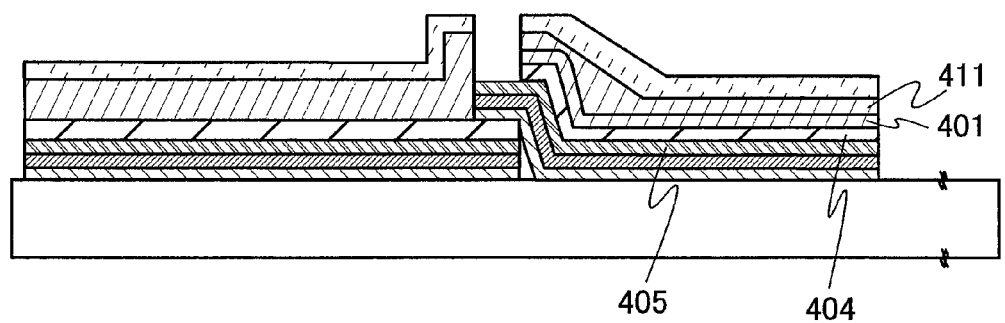

Next, as shown in FIG. 9C, the silicon oxide layer 411 and the insulating layer 401 in a region where the first single-crystalline semiconductor layer 106 and the second single-crystalline semiconductor layer 404 overlap with each other (hereinafter, the overlap region) are etched with hydrofluoric acid using the patterned resist as a mask. Further, by using the second silicon oxynitride layer 405 as an etching stopper, the second single-crystalline semiconductor layer 404 in the overlap region is etched by dry etching. The silicon oxide layer 411 is formed so as to prevent contamination due to impurities from the resist 412 to the single-crystalline semiconductor layer and is not limited to be formed of silicon oxide but is preferably formed of the same material as that of the insulating layer 401.

Figure 10A:
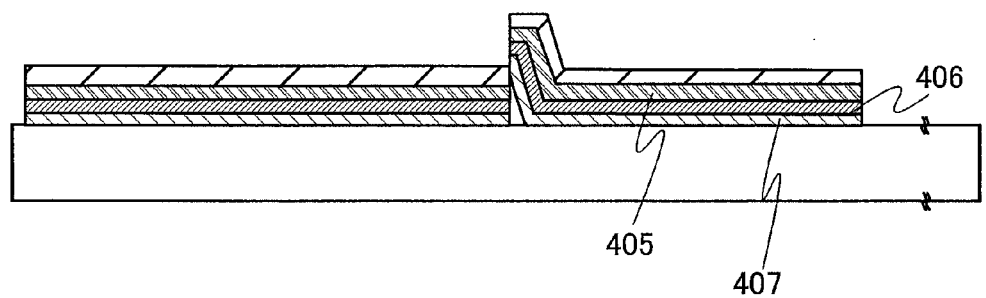
FIGS. 10A to 10B are explanatory cross-sectional views of the method for manufacturing the semiconductor substrate of the present invention.

After removal of the resist 412, as shown in FIG. 10A, the second silicon oxynitride layer 405, the second silicon nitride oxide layer 406, and the second bonding layer 407 in the overlap region are etched with hydrofluoric acid.

Figure 10B:
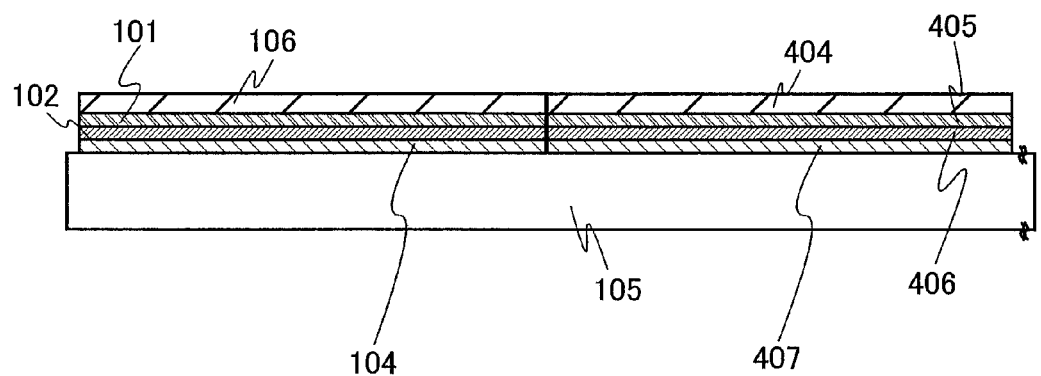

Then, heat treatment is performed at about 600° C. By utilizing expansion of a glass substrate which is used as the base substrate, a region of the bonding layer 407 which is apart from the base substrate 105 is bonded to the base substrate 105, so that the first single-crystalline semiconductor layer 106 and the second single-crystalline semiconductor layer 404 in the overlap region are joined (FIG. 10B). After the first single-crystalline semiconductor layer 106 and the second single-crystalline semiconductor layer 404 are joined, pressure treatment is preferably performed. Further, CMP may be performed so as to planarize the surfaces of the first and second single-crystalline semiconductor layers. Alternatively, the surfaces of the first and second single-crystalline semiconductor layers may be irradiated with laser light so as to be planarized without the use of physical polishing means such as CMP.

Through the above process, the semiconductor substrate of the present invention can be manufactured.

As a base substrate to which the semiconductor substrates are bonded by the method for manufacturing a semiconductor substrate of the present invention, it is possible to use any of a variety of glass substrates that are used in the electronics industry and that are referred to as non-alkaline glass substrates, such as an aluminosilicate glass substrate, an aluminoborosilicate glass substrate, and a barium borosilicate glass substrate. In other words, single-crystalline semiconductor layers can be formed over a substrate that is longer than one meter on each side. Accordingly, with the use of such a large-sized substrate, not only a display device such as a liquid crystal display but also a semiconductor integrated circuit can be manufactured.

Further, in this embodiment mode, when the second single-crystalline semiconductor layer is made to partially overlap with the first single-crystalline semiconductor layer formed over the base substrate, the second single-crystalline semiconductor layer is bonded after being transferred to the flexible substrate. Thus, the flexible substrate 410 can be arranged along the side surface of the layered structure including the first single-crystalline semiconductor layer 106. Therefore, compared to the case where the second single-crystalline substrate is just disposed so as to partially overlap with the first single-crystalline semiconductor layer, a region of the bonding layer 407 which is apart from the base substrate 105 can be downsized; so that the size of a gap formed between the first single-crystalline semiconductor layer 106 and the second single-crystalline semiconductor layer 404 can be further reduced.

In the method for manufacturing a semiconductor substrate of the present invention, when a plurality of single-crystalline semiconductor layers is bonded to a large-sized glass substrate after being separated from a plurality of single-crystalline semiconductor substrates, the size of a gap formed between the single-crystalline semiconductor layers can be reduced. Therefore, single-crystalline semiconductor layers which are used as active layers of semiconductor elements and with which high mobility of the semiconductor elements can be achieved can be formed over approximately the entire surface of the glass substrate; thus, flexibility in designing a circuit can be improved.

Note that this embodiment mode can be implemented by being freely combined with other embodiment modes.

Embodiment Mode 3

This embodiment mode will describe a semiconductor device using the semiconductor substrate which is manufactured by the manufacturing method of Embodiment Mode 1 or 2 with reference to FIGS. 11A to 11D and FIG. 12.

Figure 11A:
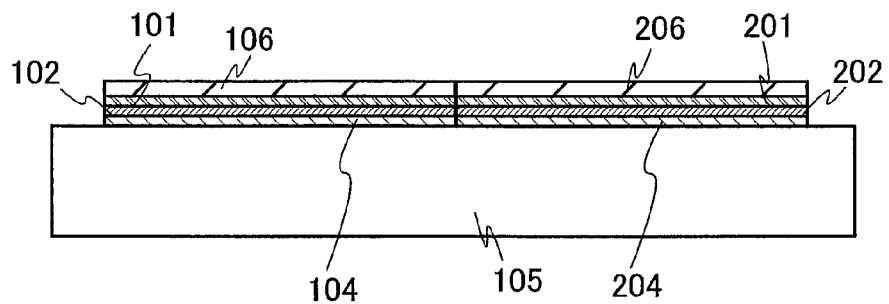
FIGS. 11A to 11D are explanatory cross-sectional views of a method for manufacturing a semiconductor device using a semiconductor substrate of the present invention.

As shown in FIG. 11A, a first single-crystalline semiconductor layer 106 and a second single-crystalline semiconductor layer 206 are formed over a base substrate 105 with a first bonding layer 104 and a second bonding layer 204, respectively, interposed therebetween by the method described in the preceding embodiment modes. A thickness of the single-crystalline semiconductor layer is preferably from 5 nm to 500 nm, more preferably from 10 nm to 200 nm. A p-type impurity element such as boron, aluminum, or gallium may be added to the single-crystalline semiconductor layer in order to control the threshold voltage. For example, boron as a p-type impurity element may be added at a concentration of from $5\times10^{17}$ cm$^{-3}$ to $1\times10^{18}$ cm$^{-3}$, inclusive. A first silicon nitride oxide layer 102 and a second silicon nitride oxide layer 202, and a first silicon oxynitride layer 101 and a second silicon oxynitride layer 201 are formed as barrier layers over the base substrate 105. By providing the barrier layers over the base substrate 105, contamination of the first and second single-crystalline semiconductor layers 106 and 206 can be prevented. Instead of the silicon nitride oxide layer, a silicon nitride layer, an aluminum nitride layer, or an aluminum nitride oxide layer may be employed.

Figure 11B:
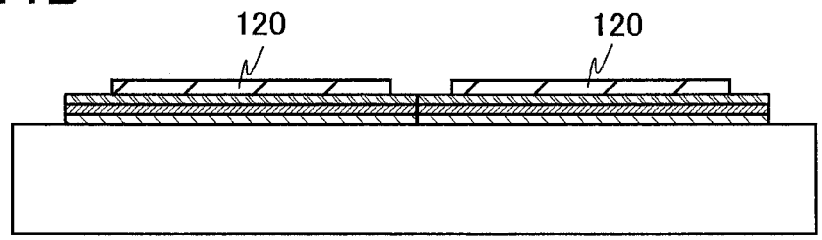

As shown in FIG. 11B, the first and second single-crystalline semiconductor layers 106 and 206 are etched to form single-crystalline semiconductor layers 120 which are isolated into island-like shapes from each other to correspond to the arrangement of semiconductor elements.

Figure 11C:
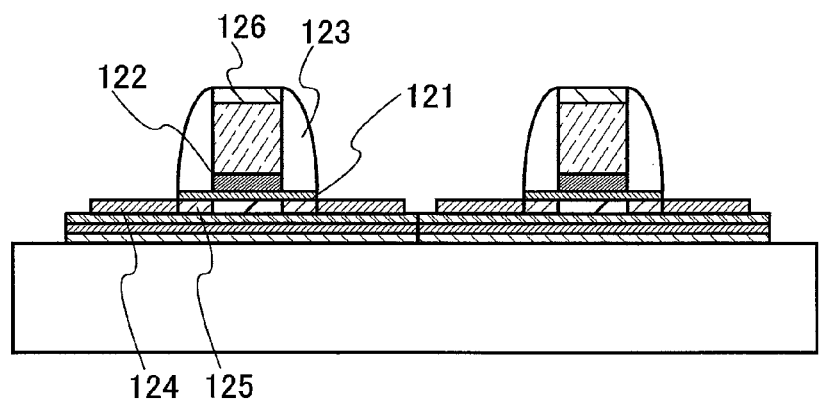

Then, as shown in FIG. 11C, a gate insulating layer 121, a gate electrode 122, and sidewall insulating layers 123 are formed over the single-crystalline semiconductor layer 120, and first impurity regions 124 and second impurity regions 125 are formed in the single-crystalline semiconductor layer 120. An insulating layer 126 is formed using silicon nitride and is used as a hard mask when the gate electrode 122 is etched.

Figure 11D:
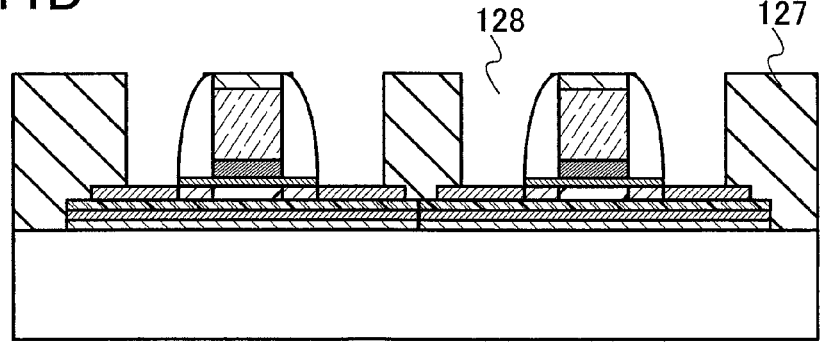

Next, as shown in FIG. 11D, an interlayer insulating layer 127 is formed. As the interlayer insulating layer 127, a borophosphosilicate glass (BPSG) film is formed or an organic resin typified by polyimide is formed by coating. In the interlayer insulating layer 127, contact holes 128 are formed. The contact holes 128 are formed in a self-alignment manner by utilizing the sidewall insulating layers 123.

Figure 12:
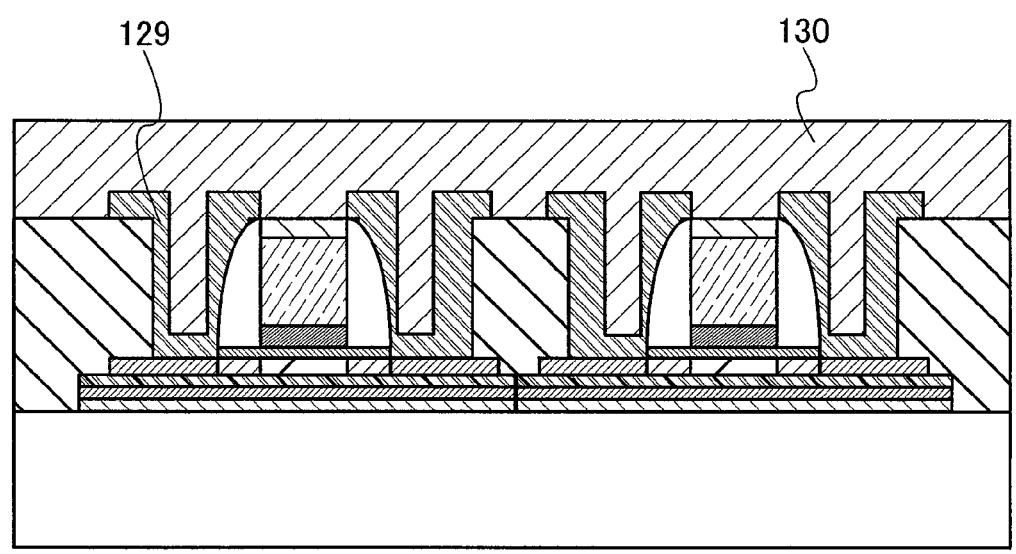
FIG. 12 is an explanatory cross-sectional view of the method for manufacturing the semiconductor device using the semiconductor substrate of the present invention.

After that, as shown in FIG. 12, wirings 129 are formed so as to cover the inner walls of the contact holes 128, and an insulating layer 130 is formed so as to cover the wirings 129. The wiring 129 is formed using aluminum or an aluminum alloy, and has barrier metals such as molybdenum, chromium, or titanium as top and bottom layers.

In this manner, field-effect transistors can be manufactured using the first and second single-crystalline semiconductor layers 106 and 206 that are bonded to the base substrate 105. The single-crystalline semiconductor layers according to this embodiment mode are formed of a single-crystalline semiconductor that has uniform crystal orientation; therefore, uniform and high-performance field-effect transistors can be obtained. In other words, it is possible to suppress inhomogeneity of values of important transistor characteristics, such as threshold voltage and mobility, and to achieve high performance such as high mobility.

Embodiment Mode 4

This embodiment mode will describe examples of semiconductor devices which are manufactured using the semiconductor substrates of the present invention.

Figure 13:
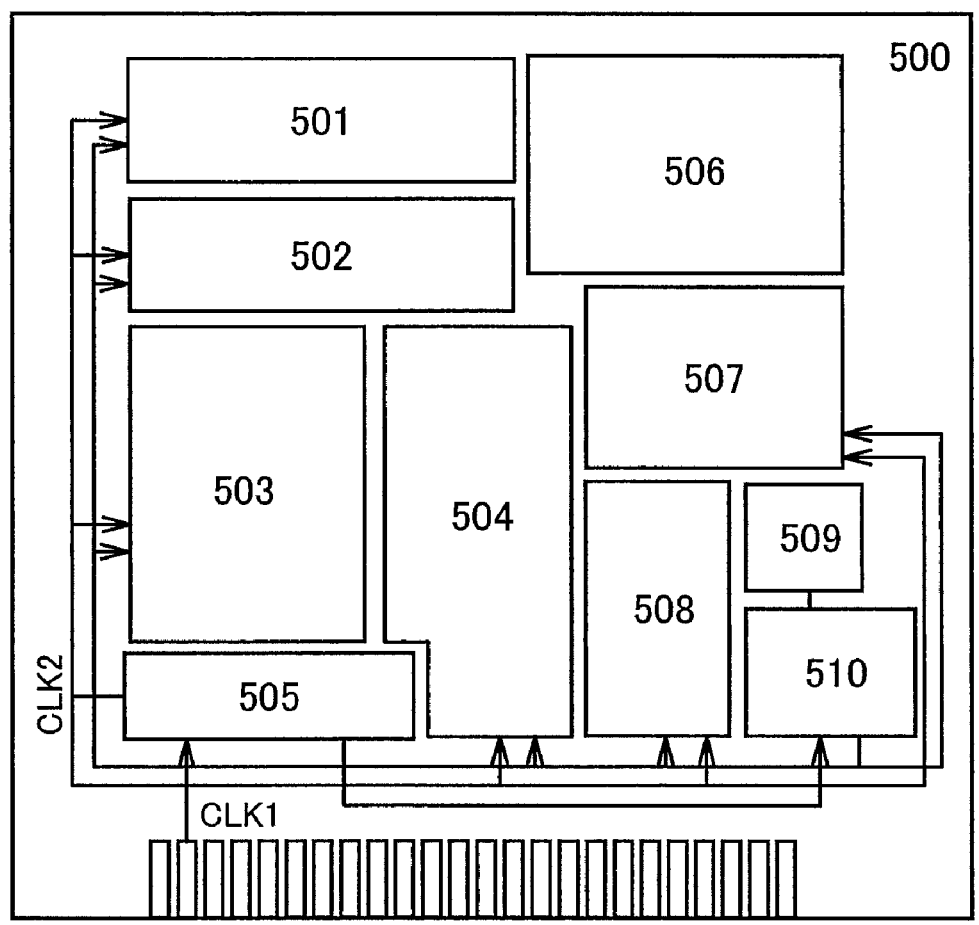
FIG. 13 is a block diagram showing a structure of a microprocessor which is obtained using a semiconductor substrate of the present invention.

FIG. 13 shows a microprocessor 500 as an example of the semiconductor device. The microprocessor 500 is manufactured using the semiconductor substrate of the present invention. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 generates signals for controlling timing of operations of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to each of the above-mentioned circuits. Note that the microprocessor 500 shown in FIG. 13 is just an example of the simplified structure, and practical microprocessors have various structures depending on usage.

The microprocessor 500 like this can achieve not only an increase in processing speed but also a reduction in power consumption because an integrated circuit is formed using semiconductor layers with uniform crystal orientation (single-crystalline semiconductor layers) which are bonded to a substrate having an insulating surface or an insulating substrate.

Figure 14:
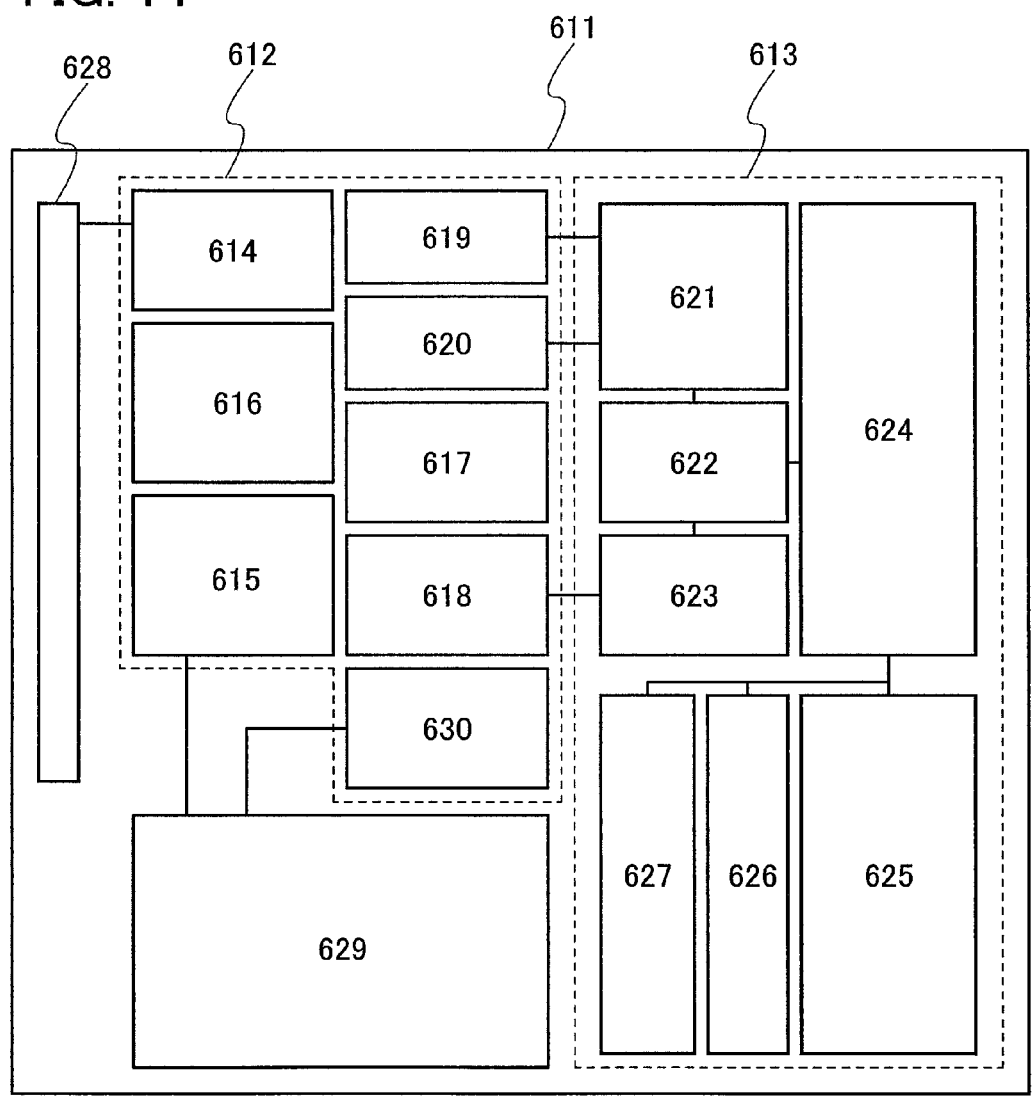
FIG. 14 is a block diagram showing a structure of an RFCPU which is obtained using a semiconductor substrate of the present invention.

Next, an example of a semiconductor device provided with an arithmetic function by which data can be transmitted and received without contact will be described with reference to FIG. 14. FIG. 14 shows an example of a computer that operates to transmit/receive signals to/from an external device by wireless communication (such a computer is hereinafter referred to as an "RFCPU"). An RFCPU 611 includes an analog circuit portion 612 and a digital circuit portion 613. The analog circuit portion 612 includes a resonant circuit 614 having a resonant capacitor, a rectifier circuit 615, a constant voltage circuit 616, a reset circuit 617, an oscillator circuit 618, a demodulation circuit 619, and a modulation circuit 620. The digital circuit portion 613 includes an RF interface 621, a control register 622, a clock controller 623, an interface 624, a central processing unit 625, a random access memory 626, and a read only memory 627.

The operation of the RFCPU 611 having such a structure is exemplarily described below. The resonance circuit 614 generates an induced electromotive force based on a signal received by an antenna 628. The induced electromotive force is stored in a capacitor portion 629 through the rectifier circuit 615. The capacitor portion 629 is preferably formed using a capacitor such as a ceramic capacitor or an electric double layer capacitor. The capacitor portion 629 does not need to be integrated with the RFCPU 611 and it is acceptable as long as the capacitor portion 629 is mounted as a different component on a substrate having an insulating surface which is included in the RFCPU 611.

The reset circuit 617 generates a signal that resets and initializes the digital circuit portion 613. For example, the reset circuit 617 generates, as a reset signal, a signal that rises with delay after increase in the power supply voltage. The oscillator circuit 618 changes the frequency and the duty ratio of a clock signal depending on a control signal generated by the constant voltage circuit 616. The demodulation circuit 619 having a low pass filter, for example, binarizes changes in amplitude of reception signals of an amplitude shift keying (ASK) system. The modulation circuit 620 transmits data after changing the amplitude of the ASK transmission signal. The modulation circuit 620 changes the amplitude of a communication signal by changing a resonance point of the resonance circuit 614. The clock controller 623 generates a control signal for changing the frequency and the duty ratio of the clock signal in accordance with the power supply voltage or current consumption in the central processing unit 625. The power supply voltage is monitored by a power management circuit 630.

A signal that is input to the RFCPU 611 from the antenna 628 is demodulated by the demodulation circuit 619, and then divided into a control command, data, and the like by the RF interface 621. The control command is stored in the control register 622. The control command includes reading of data stored in the read only memory 627, writing of data to the random access memory 626, an arithmetic instruction to the central processing unit 625, and the like. The central processing unit 625 accesses the read only memory 627, the random access memory 626, and the control register 622 via the CPU interface 624. The CPU interface 624 has a function of generating an access signal for any of the read only memory 627, the random access memory 626, and the control register 622 based on an address the central processing unit 625 requests.

As an arithmetic method of the central processing unit 625, a method may be employed in which the read only memory 627 stores an operating system (OS) and a program is read at the time of starting operation and then executed. Alternatively, a method can be employed in which a circuit dedicated to arithmetic is formed and an arithmetic process is performed using hardware. In a method in which both hardware and software are used, a method can be used in which part of arithmetic process is performed in the circuit dedicated to arithmetic and the other part of the arithmetic process is performed by the central processing unit 625 using a program.

The RFCPU 611 like this can achieve not only an increase in processing speed but also a reduction in power consumption because an integrated circuit is formed using semiconductor layers with uniform crystal orientation (single-crystalline semiconductor layers) which are bonded to a substrate having an insulating surface or an insulating substrate. This makes it possible to ensure the operation for a long period of time even when the capacitor portion 629 which supplies power is downsized.

Figure 15:
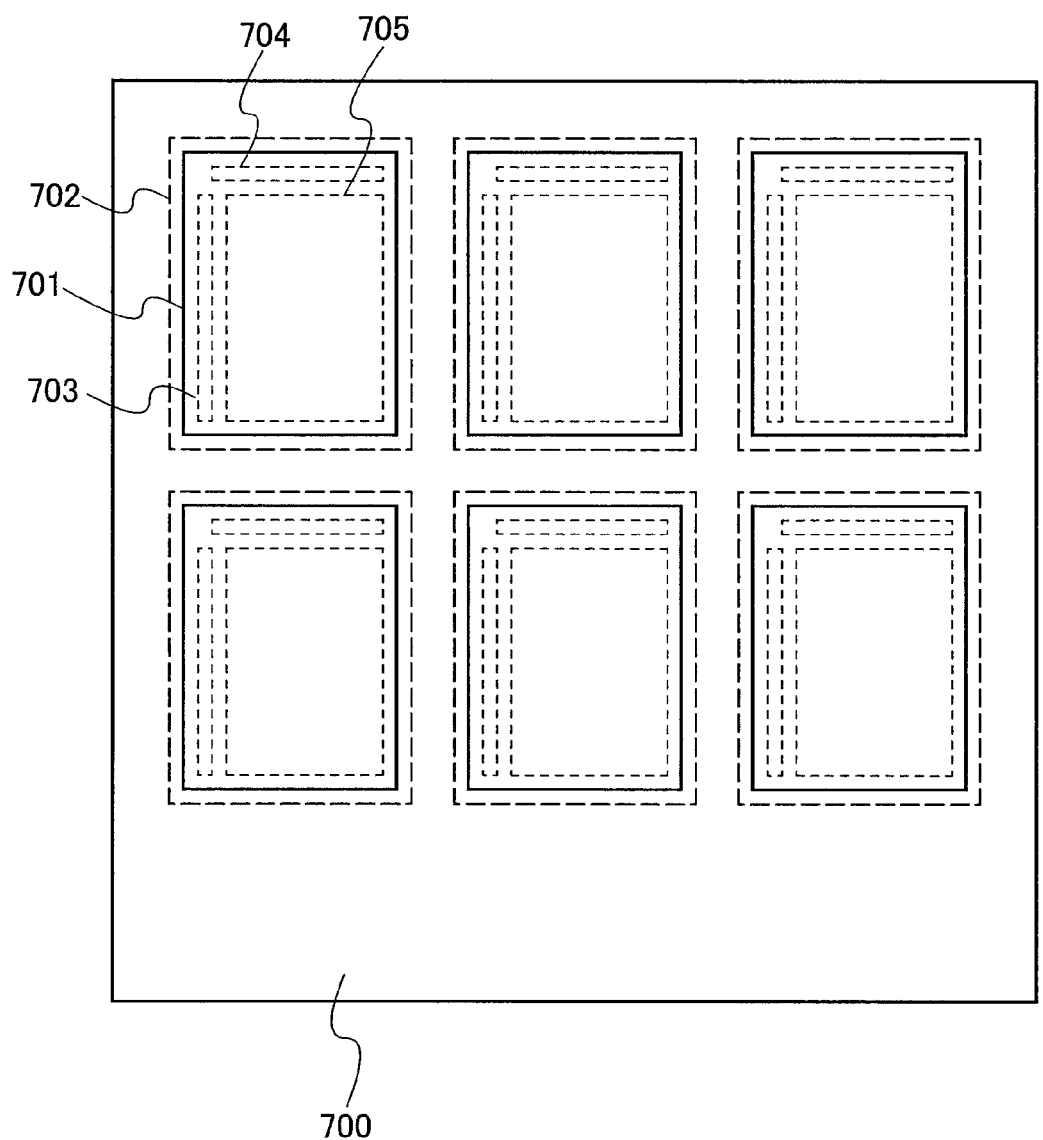
FIG. 15 is a plane view showing an example in the case of bonding single-crystalline semiconductor layers to a mother glass with which display panels are manufactured.

Single-crystalline semiconductor layers manufactured by the manufacturing method of the present invention can be bonded to a large-sized glass substrate called a mother glass which is used to manufacture display panels. FIG. 15 shows the case where the single-crystalline semiconductor layers are bonded to a mother glass that is used as a base substrate 700. By the manufacturing method of a semiconductor substrate of the present invention, even when the substrate is increased in size, the single-crystalline semiconductor layers can be formed over approximately the entire surface of the base substrate. A plurality of display panels is taken from the mother glass; thus, single-crystalline semiconductor layers 701 are preferably bonded so as to match formation regions of display panels 702. The display panel 702 includes a scanning line driver circuit region 703, a signal line driver circuit region 704, and a pixel formation region 705, and the single-crystalline semiconductor layer 701 is bonded to the base substrate 700 (mother glass) so as to include these regions.

Figure 16A:
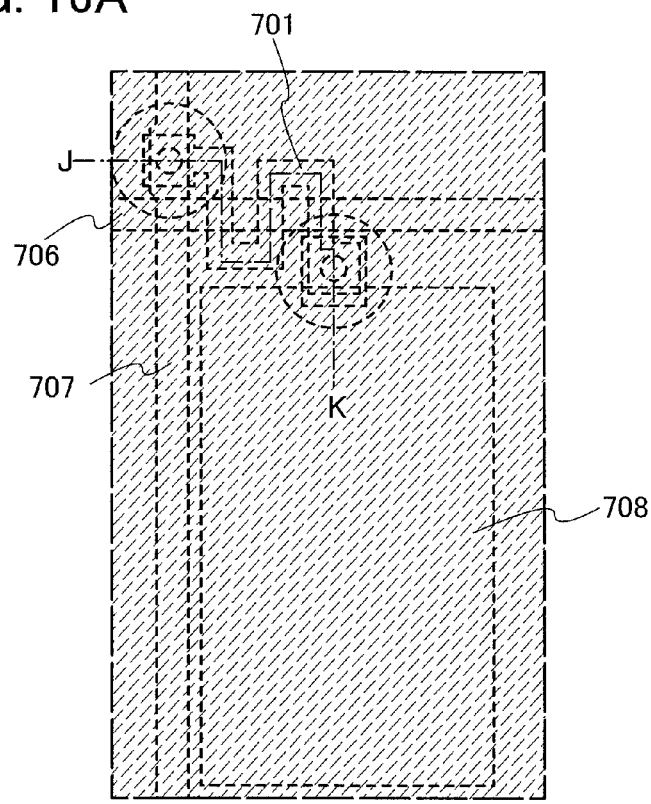
FIGS. 16A and 16B show an example of a display panel in which a pixel transistor is formed using a semiconductor substrate of the present invention.
Figure 16B:
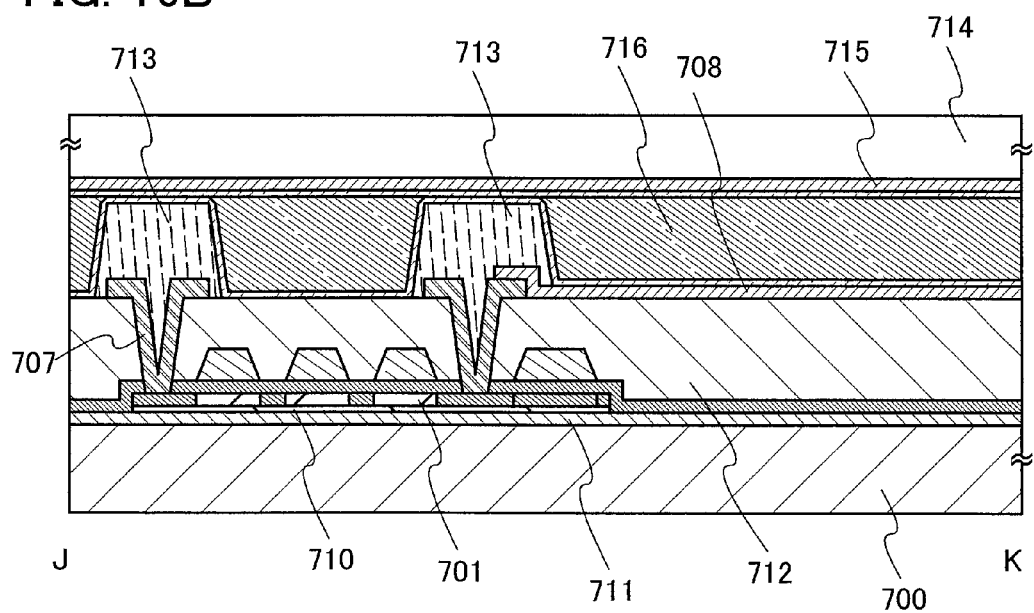

FIGS. 16A and 16B show an example of a pixel of a display panel in which a pixel transistor is formed using the single-crystalline semiconductor layer 701. FIG. 16A is a plane view of the pixel in which a gate wiring 706 intersects the single-crystalline semiconductor layer 701, and a source wiring 707 and a pixel electrode 708 are connected to the single-crystalline semiconductor layer 701. FIG. 16B is a cross-sectional view of a cross section taken along a line J-K in FIG. 16A.

In FIG. 16B, a silicon nitride layer and a silicon oxide layer are stacked as a barrier layer 711 over the base substrate 700. The single-crystalline semiconductor layer 701 is bonded to the barrier layer 711 with the use of a bonding layer 710. The pixel electrode 708 is provided over an insulating layer 712. In contact holes through which the single-crystalline semiconductor layer 701 is connected to the source wiring 707, steps in the form of a depression are generated when the insulating layer 712 is etched, and columnar spacers 713 are provided so as to fill the steps. A counter electrode 715 is formed on a counter substrate 714, and a liquid crystal layer 716 is formed in a gap formed by the columnar spacers 713.

As described above, single-crystalline semiconductor layers can also be formed over a mother glass with which display panels are manufactured, so that transistors can be formed. The transistor formed using the single-crystalline semiconductor layer is superior to an amorphous silicon transistor in all operating characteristics such as capacity of current drive; therefore, the transistor can be downsized. Accordingly, an aperture ratio of a pixel portion in a display panel can be improved. Further, since a microprocessor and RFCPU like the ones shown in FIG. 13 and FIG. 14 can be formed, a function as a computer can be provided in a display panel. Moreover, a display which is capable of inputting and outputting data without contact can be manufactured.

This application is based on Japanese Patent Application Serial No. 2007-166725 filed with Japan Patent Office on Jun. 25, 2007, the entire contents of which are hereby incorporated by reference.

What is claimed is:

1. A semiconductor substrate comprising:
    a base substrate having an insulating surface;
    a first bonding layer over a first region of the base substrate;
    a first silicon nitride oxide layer over the first bonding layer;
    a first silicon oxynitride layer over the first silicon nitride oxide layer;
    a first single-crystalline semiconductor layer over the first silicon oxynitride layer;
    a second bonding layer over a second region of the base substrate adjacent to the first region of the base substrate;
    a second silicon nitride oxide layer over the second bonding layer;
    a second silicon oxynitride layer over the second silicon nitride oxide layer;
    a second single-crystalline semiconductor layer over the second silicon oxynitride layer,
    wherein a side surface of the first bonding layer and a side surface of the second bonding layer are in direct contact with each other, so as to form a first interface between the first bonding layer and the second bonding layer,
    wherein a side surface of the first single-crystalline semiconductor layer and a side surface of the second single-crystalline semiconductor layer are in direct contact with each other, so as to form a second interface between the first single-crystalline semiconductor layer and the second single-crystalline semiconductor layer.

2. A semiconductor substrate according to claim 1, wherein a silicon oxide layer is formed as the first bonding layer and the second bonding layer.

3. A semiconductor substrate according to claim 2, wherein the silicon oxide layer is formed by a chemical vapor deposition method using organic silane as a source gas.

4. A semiconductor substrate according to claim 3, wherein the organic silane is any one of tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$).

5. A semiconductor substrate according to claim 1, wherein the first silicon oxynitride layer and the second silicon oxynitride layer are layers that contain more oxygen than nitrogen.

6. A semiconductor substrate according to claim 1, wherein the first silicon nitride oxide layer and the second silicon nitride oxide layer are layers that contain more nitrogen than oxygen.

7. A semiconductor substrate according to claim 1,
    wherein a thickness of the first single-crystalline semiconductor layer is from 5 to 500 nm, and
    wherein a thickness of the second single-crystalline semiconductor layer is from 5 to 500 nm.

8. A semiconductor substrate according to claim
    wherein the first bonding layer is in direct contact with the base substrate, and
    wherein the second bonding layer is in direct contact with the base substrate.

9. A semiconductor substrate according to claim 1, wherein a thickness of the first bonding layer is 5 to 500 nm.

10. A semiconductor formed using the semiconductor substrate according to claim 1, comprising at least one of the group consisting of a CPU, a transistor, a liquid crystal layer, a processor, and a driver circuit region.

11. A semiconductor substrate according to claim 1,
    wherein a side surface of the first silicon nitride oxide layer and a side surface of the second silicon nitride oxide layer are in direct contact with each other, so as to form a third interface between the first silicon nitride oxide layer and the second silicon nitride oxide layer,
    wherein a side surface of the first silicon oxynitride layer and a side surface of the second silicon oxynitride layer are in direct contact with each other, so as to form a fourth interface between the first silicon oxynitride layer and the second silicon oxynitride layer, and
    wherein the first interface, the second interface, the third interface, and the fourth interface are aligned with each other.

12. A semiconductor substrate comprising:
    a glass substrate;
    a first bonding layer over a first region of the glass substrate;
    a first silicon nitride oxide layer over the first bonding layer;
    a first silicon oxynitride layer over the first silicon nitride oxide layer;
    a first single-crystalline semiconductor layer over the first silicon oxynitride layer;
    a second bonding layer over a second region of the glass substrate adjacent to the first region of the glass substrate;
    a second silicon nitride oxide layer over the second bonding layer;
    a second silicon oxynitride layer over the second silicon nitride oxide layer;
    a second single-crystalline semiconductor layer over the second silicon oxynitride layer,
    wherein a side surface of the first bonding layer and a side surface of the second bonding layer are in direct contact with each other, so as to form a first interface between the first bonding layer and the second bonding layer,
    wherein a side surface of the first single-crystalline semiconductor layer and a side surface of the second single-crystalline semiconductor layer are in direct contact with each other, so as to form a second interface between the first single-crystalline semiconductor layer and the second single-crystalline semiconductor layer.

13. A semiconductor substrate according to claim 12, wherein a silicon oxide layer is formed as the first bonding layer and the second bonding layer.

14. A semiconductor substrate according to claim 13, wherein the silicon oxide layer is formed by a chemical vapor deposition method using organic silane as a source gas.

15. A semiconductor substrate according to claim 14, wherein the organic silane is any one of tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$).

16. A semiconductor substrate according to claim 12, wherein the first silicon oxynitride layer and the second silicon oxynitride layer are layers that contain more oxygen than nitrogen.

17. A semiconductor substrate according to claim 12, wherein the first silicon nitride oxide layer and the second silicon nitride oxide layer are layers that contain more nitrogen than oxygen.

18. A semiconductor substrate according to claim 12,
wherein a thickness of the first single-crystalline semiconductor layer is from 5 to 500 nm, and
wherein a thickness of the second single-crystalline semiconductor layer is from 5 to 500 nm.

19. A semiconductor substrate according to claim 12,
wherein the first bonding layer is in direct contact with the glass substrate, and
wherein the second bonding layer is in direct contact with the glass substrate.

20. A semiconductor substrate according to claim 12, wherein a thickness of the first bonding layer is 5 to 500 nm.

21. A semiconductor formed using the semiconductor substrate according to claim 12, comprising at least one of the group consisting of a CPU, a transistor, a liquid crystal layer, a processor, and a driver circuit region.

22. A semiconductor substrate according to claim 12,
wherein a side surface of the first silicon nitride oxide layer and a side surface of the second silicon nitride oxide layer are in direct contact with each other, so as to form a third interface between the first silicon nitride oxide layer and the second silicon nitride oxide layer,
wherein a side surface of the first silicon oxynitride layer and a side surface of the second silicon oxynitride layer are in direct contact with each other, so as to form a fourth interface between the first silicon oxynitride layer and the second silicon oxynitride layer, and
wherein the first interface, the second interface, the third interface, and the fourth interface are aligned with each other.

* * * * *

UNITED STATES PATENT AND TRADEMARK OFFICE
CERTIFICATE OF CORRECTION

PATENT NO. : 8,330,221 B2
APPLICATION NO. : 12/853518
DATED : December 11, 2012
INVENTOR(S) : Koichiro Tanaka Page 1 of 1

It is certified that error appears in the above-identified patent and that said Letters Patent is hereby corrected as shown below:

At column 19, line 64, "semiconductor formed" should be --semiconductor device formed--;

At column 21, line 13, "semiconductor formed" should be --semiconductor device formed--.

Signed and Sealed this
Nineteenth Day of March, 2013

Teresa Stanek Rea
*Acting Director of the United States Patent and Trademark Office*